United States Patent
Galipeau et al.

(10) Patent No.: US 12,309,928 B2
(45) Date of Patent: May 20, 2025

(54) INTERLOCKED CIRCUIT BOARD ELEMENTS AND ASSEMBLIES

(71) Applicant: Infineon Technologies Austria AG, Villach (AT)

(72) Inventors: Darryl Galipeau, Warwick, RI (US); Danny Clavette, Greene, RI (US); Darryl Tschirhart, Cambridge (CA)

(73) Assignees: Infineon Technologies Austria AG, Villach (AT); Cypress Semiconductor (Canada), Inc., Toronto (CA)

( * ) Notice: Subject to any disclaimer, the term of this patent is extended or adjusted under 35 U.S.C. 154(b) by 190 days.

(21) Appl. No.: 17/952,859

(22) Filed: Sep. 26, 2022

(65) Prior Publication Data

US 2024/0107669 A1 Mar. 28, 2024

(51) Int. Cl.
*H05K 1/02* (2006.01)
*H02M 3/00* (2006.01)
*H05K 1/09* (2006.01)
*H05K 1/14* (2006.01)
*H05K 1/18* (2006.01)
*H05K 3/36* (2006.01)
*H05K 5/03* (2006.01)
*H02M 3/158* (2006.01)

(52) U.S. Cl.
CPC .............. *H05K 1/14* (2013.01); *H02M 3/003* (2021.05); *H05K 1/141* (2013.01); *H05K 1/145* (2013.01); *H05K 1/18* (2013.01); *H05K 3/366* (2013.01); *H02M 3/1584* (2013.01); *H05K 2201/047* (2013.01); *H05K 2201/09163* (2013.01); *H05K 2201/10015* (2013.01); *H05K 2201/1003* (2013.01); *H05K 2201/10166* (2013.01)

(58) Field of Classification Search
CPC ...... H05K 1/02; H05K 1/0204; H05K 1/0219; H05K 1/09; H05K 1/14; H05K 1/18; H05K 1/111; H05K 1/114; H05K 1/141; H05K 1/145; H05K 1/148; H05K 1/185; H05K 3/366; H05K 3/3447; H05K 5/003; H05K 7/20918; H05K 2201/048; H05K 2201/09809; H05K 2201/10568; H05K 2201/10371
USPC ....... 361/782, 695, 704, 719, 729, 768, 784, 361/803; 333/101, 105; 336/221, 232
See application file for complete search history.

(56) References Cited

U.S. PATENT DOCUMENTS 5,481,073 A * 1/1996 Singer ..................... H01P 3/081
307/115
5,930,112 A * 7/1999 Babinski ............ H05K 7/20918
363/141
6,396,458 B1 * 5/2002 Cockson ................ H03H 5/003
343/702

(Continued)

FOREIGN PATENT DOCUMENTS

GB 2577211 A 3/2020
WO 2021211682 A1 10/2021

OTHER PUBLICATIONS

Extended Search Report, EP 23 19 0918, Feb. 6, 2024, pp. 1-8.

*Primary Examiner* — Xiaoliang Chen
(74) *Attorney, Agent, or Firm* — Armis IP Law, LLC

(57) ABSTRACT

A circuit board assembly may include a first circuit board including a first slot. The circuit board assembly may include a second circuit board. The first circuit board may be interlocked with the second circuit board via interlocking provided by the second circuit board into the first slot.

22 Claims, 15 Drawing Sheets

(56) References Cited

U.S. PATENT DOCUMENTS

| | | | | |
|---|---|---|---|---|
| 6,522,156 | B2* | 2/2003 | Tustaniwskyj | G01R 31/01 324/762.02 |
| 2009/0034222 | A1* | 2/2009 | Smith | H05K 3/366 29/829 |
| 2010/0271012 | A1* | 10/2010 | Patterson | G01B 7/14 324/207.15 |
| 2014/0085848 | A1* | 3/2014 | Zeng | H01F 27/29 361/768 |
| 2016/0055948 | A1* | 2/2016 | Yosui | H01F 17/0006 336/232 |
| 2016/0181692 | A1* | 6/2016 | Viscarra | H01Q 13/10 343/770 |
| 2016/0268034 | A1 | 9/2016 | Subat et al. | |
| 2019/0385959 | A1* | 12/2019 | Xu | H01L 23/645 |
| 2020/0113053 | A1* | 4/2020 | Xiong | H05K 1/0204 |
| 2022/0093546 | A1* | 3/2022 | Elsherbini | H01L 25/0657 |
| 2022/0103066 | A1* | 3/2022 | Chen | H02M 3/04 |

* cited by examiner

INTERLOCKED CIRCUIT BOARD ELEMENTS AND ASSEMBLIES

BACKGROUND

A printed circuit board (PCB) or printed wiring board is a laminated structure of conductive layers separated by insulating layers. In general, PCBs have two functions. The first is to secure electronic components at designated locations on the outer layers of the PCB by means of affixing such as soldering. The electronic circuit instantiated by the populated circuit board is designed to provide one or more specific functions. After fabrication, the electronic circuit is powered to perform the desired functions.

Typically, a printed circuit board is a planar device on which multiple components are interconnected via traces to provide the functions as previously discussed. Such implementations of fabricating circuitry on a planar circuit board assembly is dimensionally limited, preventing high density implementation of circuitry.

BRIEF DESCRIPTION

Implementation of clean energy (or green technology) is very important to reduce our impact as humans on the environment. In general, clean energy includes any evolving methods and materials to reduce an overall toxicity of energy consumption on the environment.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, etc. Regardless of whether energy is received from green energy sources or non-green energy sources, it is desirable to make most efficient use of raw energy provided by such systems to reduce our impact on the environment. This disclosure contributes to reducing our carbon footprint (and green energy) via more efficient energy conversion and circuit implementations supporting same.

As discussed herein, a fabricator produces one or more assemblies to provide higher density circuitry than provided by conventional instantiation of circuitry on planar circuit boards.

More specifically, this disclosure includes an apparatus, systems, methods, etc. The apparatus such as a first assembly may include a first circuit board including a first slot. The apparatus further includes a second circuit board. The first circuit board is interlocked with the second circuit board via interlocking provided by the second circuit board into the first slot.

A first portion of the second circuit board may reside within the first slot of the first circuit board.

The second circuit board may include a second slot as well. In such an instance, the first circuit board may be interlocked with the second circuit board via interlocking provided by a combination of the first slot and the second slot. Yet further, in order to provide interlocking, a first portion of the first circuit board may reside within the second slot of the second circuit board; a first portion of the second circuit board may reside within the first slot of the first circuit board.

The apparatus as discussed herein may further include first circuitry and second circuitry. The first circuitry may be disposed on a surface of the first circuit board; the second circuitry may be disposed on a surface of the second circuit board.

The apparatus may further include a third circuit board and a fourth circuit board. The first circuit board may be in contact with and interlocked with the second circuit board and the fourth circuit board but not the third circuit board; the second circuit board may be in contact with and interlocked with the first circuit board and the third circuit board but not the first circuit board.

Still further, the apparatus may include an inductor device. A combination of the first circuit board, the second circuit board, the third circuit board, and the fourth circuit board may enclose a volume in which the inductor device resides. The combination of multiple interlocked circuit boards may reside between a first circuit substrate and a second circuit substrate. The inductor device may be affixed to either or both of the first circuit board and the second circuit board.

The assembly of multiple interlocked circuit boards as previously discussed may reside between a first host substrate and a second host substrate. A first axial end of the inductor may be coupled to the first (host) circuit substrate and a second axial end of the inductor may be coupled to the second (host) circuit substrate. As previously discussed, the combination of multiple interlocked circuit boards may reside between a first circuit substrate and a second circuit substrate.

The apparatus as discussed herein may further include a power converter circuit disposed on a first circuit substrate. In such an instance, the interlocked first circuit board and the second circuit board provide connectivity between the power converter circuit and the second substrate. The first circuit substrate may be disposed substantially parallel to the second circuit substrate. Both the first circuit board and the second circuit board may be disposed substantially orthogonal to the first circuit substrate and the second circuit substrate.

Yet further, the apparatus may include an inductor disposed between the power converter circuit and the second substrate. The inductor is operative to convey current from the power converter circuit to the load. The first circuit board and/or the second circuit board may provide a return current path from the load to a reference potential associated with the power converter circuit. In such an instance, the return current used by the load returns through the one or more circuit boards.

The apparatus may include first capacitors disposed on the first circuit board or the second circuit board. The first capacitors store an input voltage. The apparatus may further include second capacitors disposed on the first circuit board or the second circuit board. The second capacitors store an output voltage. The power converter can be configured to convert the input voltage into the output voltage.

The first circuit board may be disposed non-parallel to the second circuit board; the first circuit board may be interlocked with the second circuit board via physical interlocking provided by a portion of the second circuit board in the first slot.

The apparatus may further include: i) a first edge contact element disposed on a first axial end (first edge) of the first circuit board, and ii) a second edge contact element disposed on a second axial end (second edge) of the first circuit board. The first circuit board provides electrical connectivity between the first edge contact element and the second edge contact element.

The first circuit board may include a first axial end and a second axial end; the first slot may extend through a less-than-all length of the first circuit board starting from the first axial end of the first circuit board towards the second axial end of the first circuit board.

This disclosure further includes: i) multiple slotted primary circuit boards spaced apart from each other and disposed substantially parallel to each other, and ii) multiple slotted secondary circuit boards spaced apart from each other and disposed substantially parallel to each other. The first slots in the multiple slotted primary circuit boards and second slots in the multiple slotted secondary circuit boards may interlock the multiple slotted primary circuit boards and the multiple slotted secondary circuit boards.

Each of the multiple slotted primary circuit boards may include a respective first slot. Each of the multiple slotted secondary circuit boards may include a respective second slot. Portions of the multiple slotted primary circuit boards may reside in the respective second slots of the multiple slotted secondary circuit boards. Portions of the multiple slotted secondary circuit boards may reside in respective first slots of the multiple slotted primary circuit boards.

The apparatus may further include multiple cavities defined by surfaces of the multiple slotted primary circuit boards and surfaces of the multiple slotted secondary circuit boards.

Yet further, the apparatus as discussed herein may include: multiple primary circuit boards spaced apart from each other and disposed substantially parallel to each other; and multiple secondary circuit boards spaced apart from each other and disposed substantially parallel to each other. As previously discussed, and as further discussed herein, the multiple spaced apart primary circuit boards may be interlocked with the spaced apart secondary circuit boards to create cavities.

The apparatus may further include first electronic circuitry and second electronic circuitry. The cavities may include a first cavity and a second cavity. The first electronic circuitry may be disposed on a surface of a first primary circuit board in the first cavity. The second electronic circuitry may be disposed on a surface of a first secondary circuit board in the first cavity. The apparatus may further include a first inductor and a second inductor. The cavities may include a first cavity and a second cavity or any number of cavities. The first inductor may extend through the first cavity from a first circuit substrate to a second circuit substrate; the second inductor nay extend through the second cavity from the first circuit substrate to the second circuit substrate.

Note that this disclosure includes useful techniques. For example, in contrast to conventional techniques, the novel circuit as discussed herein provides a way to fabricate high density circuitry via uniquely interlocked circuit boards.

Note further that any of the resources as discussed herein can include one or more computerized devices, apparatus, hardware, etc., execute and/or support any or all of the method operations disclosed herein. In other words, one or more computerized devices or processors can be programmed and/or configured to operate as explained herein to carry out the different techniques as described herein.

Other aspects of the present disclosure include software programs and/or respective hardware to perform any of the operations summarized above and disclosed in detail below.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of techniques herein (BRIEF DESCRIPTION) purposefully does not specify every novel aspect of the present disclosure or claimed invention(s). Instead, this brief description only presents general aspects and corresponding points of novelty over conventional techniques. For additional details and/or possible perspectives (permutations) of the invention(s), the reader is directed to the Detailed Description section (which is a summary) and corresponding figures of the present disclosure as further discussed below.

Figure 1:
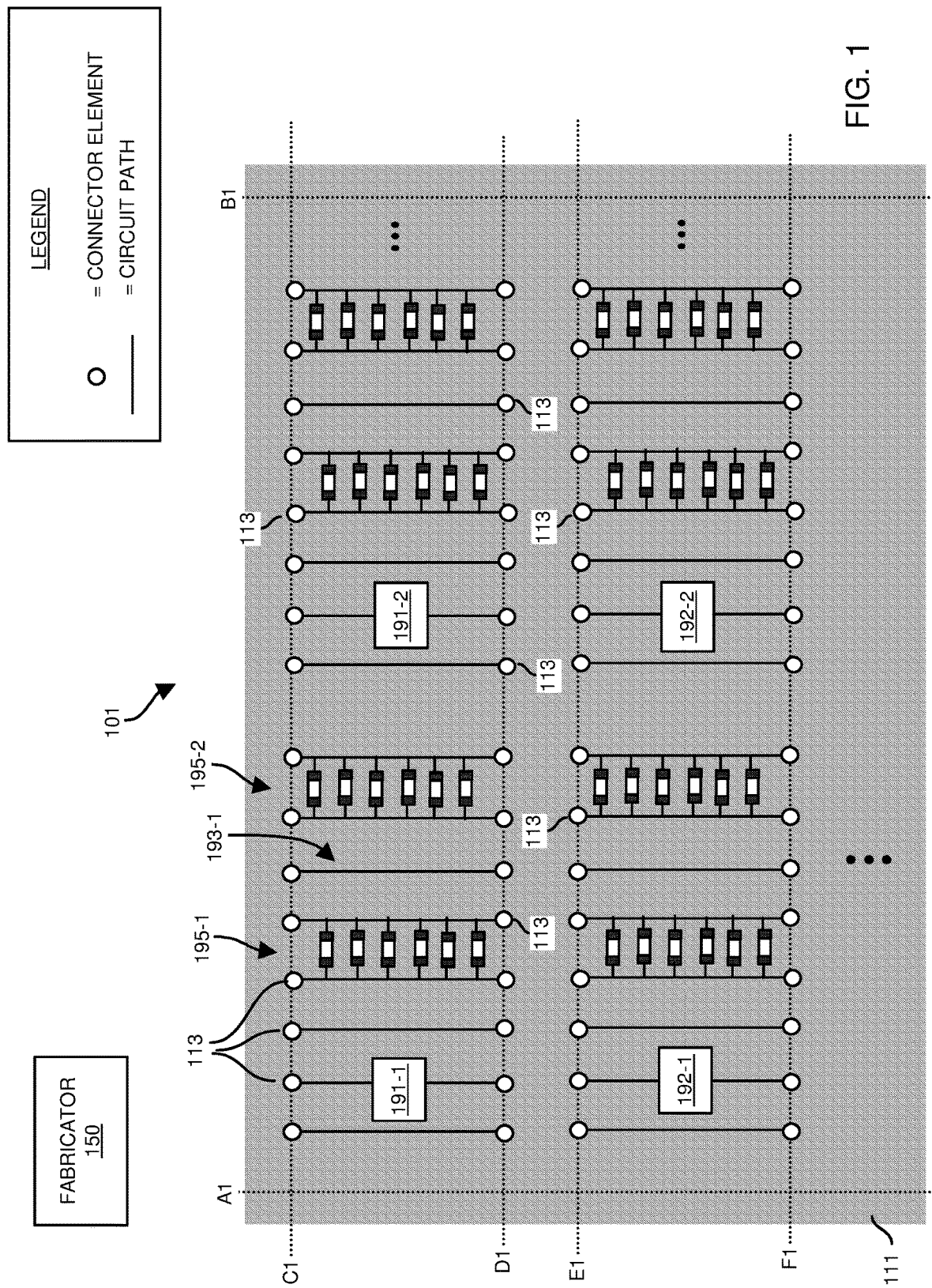
FIG. 1 is an example illustrating fabrication and population of a circuit substrate to produce a circuit assembly as discussed herein.

The foregoing and other objects, features, and advantages of the disclosed matter herein will be apparent from the following more particular description herein, as illustrated in the accompanying drawings in which like reference characters refer to the same parts throughout the different views. The drawings are not necessarily to scale, with emphasis instead being placed upon illustrating the principles, concepts, aspects, techniques, etc.

DETAILED DESCRIPTION

As previously discussed, this disclosure is useful over conventional techniques. For example, in contrast to conventional techniques, the novel assemblies as discussed herein support fabrication of high density circuits (such as power converter circuits).

Now, more specifically, FIG. 1 is an example illustrating fabrication and population of a circuit substrate to produce one or more circuit assemblies as discussed herein.

As shown in FIG. 1, fabricator 150 or other suitable entity fabricates the assembly 101 to include a circuit substrate 111. Substrate 111 includes multiple connector elements 113, circuitry 191 (circuitry 191-1, 191-2, etc.), circuitry 195-1, 195-2, etc.

In this example, the circuit board 111 (such as a printed circuit board) includes: i) a first sequence of connector elements 113 (such as vias or the like providing contacts, pins, pads, etc.) disposed along axis C1, ii) a second sequence of connector elements 113 disposed along axis D1, iii) a third sequence of connector elements 113 disposed along axis E1, iv) a fourth sequence of connector elements 113 disposed along axis F1, and so on.

Circuit paths 193-1 (such as traces, electrically conductive paths, metal layers, etc.) associated with (on or in layers of) the circuit board 111 provide connectivity of circuitry and nodes such as circuit 191-1, 192-1, 195-1, 195-2, etc., between sets of connector elements 113 or between each other as needed.

The portion of circuit board 111 between pairs of axes (such as axes pair C1/D1, axes pair E1/F1, and so on) on the circuit board 111 can be populated with any circuit elements (such as capacitors, resistors, etc.) with any connectivity from one axis of connector elements to another in the pair. Alternatively, the portions of the circuit board between axes pairs can be populated after subdividing the portions.

For example, as shown, each of one or more connector elements 113 along axis C1 can be connected directly to one or more connector elements on axis D1 (such as a pass-through traces or path); each of one or more connector elements 113 along axis E1 can be connected directly to one or more connector element on axis F1; and so on.

Additionally, one or more circuit paths on the circuit board 111 provide connectivity between connector elements 113 on axis C1 and nodes of circuitry such as circuit 191-1, circuit 191-2, each of components 195-1, 195-2, etc. As further shown, one or more circuit paths provide connectivity between connector elements 113 on axis D1 and circuitry such as circuit 191-1, circuit 191-2, each of components 193-1, etc. Components circuit board oriented in any suitable manner.

In general, the connector elements 113 (such as vias or the like fabricated from electrically conductive material such as metal, copper, tin, etc.) may be metallic lined holes, each connected to a same or different circuit path of the circuit board 111. First connector elements 113 provide connectivity to convey electrical signals between the one or more different layers of the circuit board 111 and/or connectivity from one set of connector elements on a first axis such as axis C1 and second axis such as axis D1. Second connector elements 113 provide connectivity to convey electrical signals between the different one or more layers of the circuit board 111 and/or connectivity from one set of connector elements on a first axis such as axis E1 and second axis such as axis FIG. 1, and so on.

Note that the fabricator can be configured to further processes the assembly 101 to produce multiple sub-assemblies. For example, the fabricator 150 can be configured to cut along each of the axes A1, B1, C1, D1, E1, F1, etc., to produce the sub-assemblies in FIG. 2. Note that the components, circuitry, etc., may be affixed to the respective surface of circuit board 111 before or after the circuit board is cut into sub-portions (i.e., smaller circuit boards).

Figure 2:
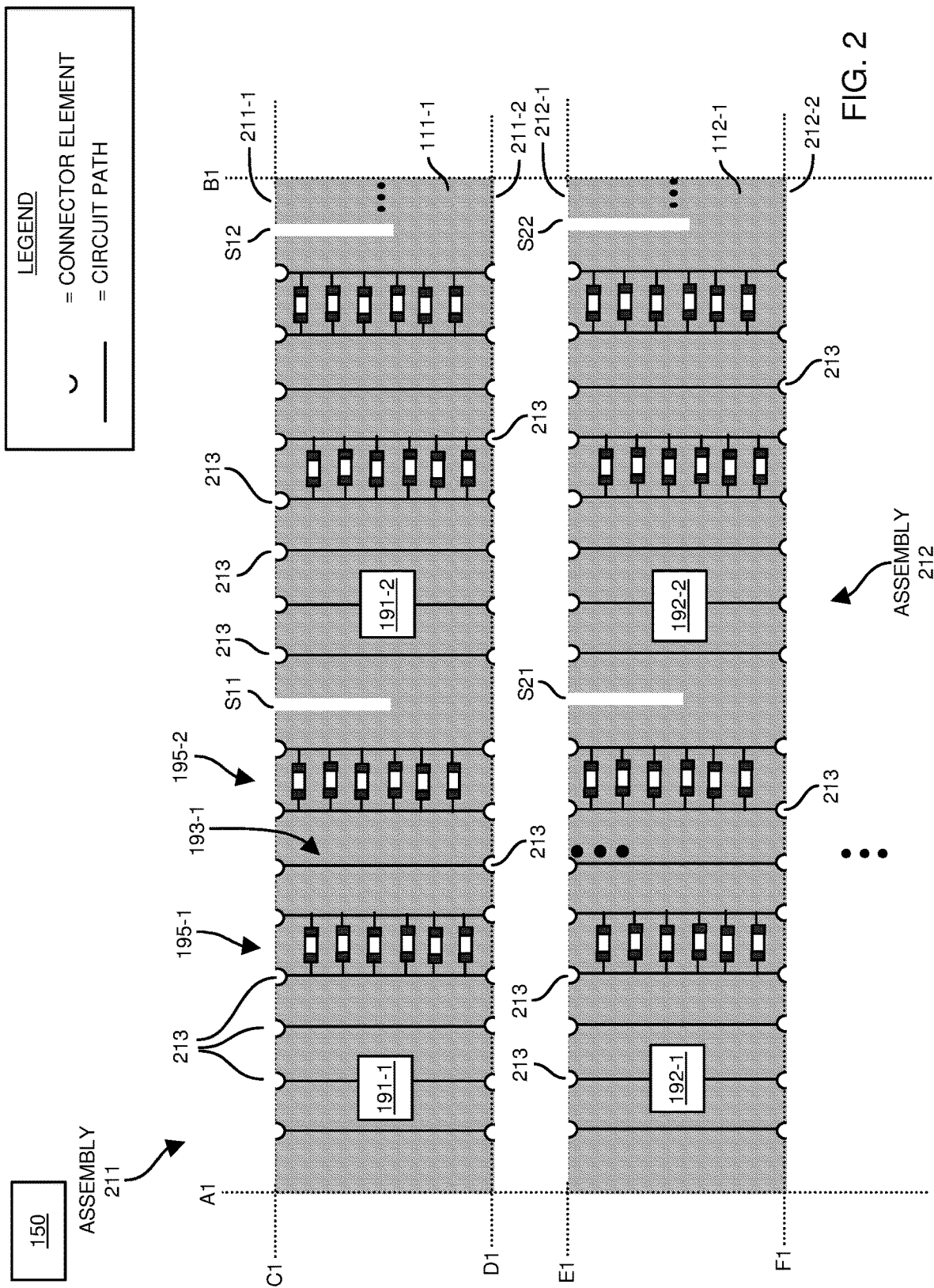
FIG. 2 is an example top view diagram illustrating dicing (a.k.a., cutting, dividing, processing, etc.) of the populated circuit substrate (or unpopulated circuit substrate) and creating slots to produce multiple sub-assemblies of interlocked circuit boards as discussed herein.

FIG. 2 is an example top view diagram illustrating results of dicing (a.k.a., cutting, dividing, etc.) a populated circuit substrate (or unpopulated circuit substrate) to produce multiple sub-assemblies and/or sub-components as discussed herein.

As shown FIG. 2, the first assembly 211 may include a first circuit board 111-1 (portion of original circuit board 111). The first circuit board 111-1 includes first connector elements 213 (half or a less-than-all portion of connector elements 113 such as one or more connector elements 113 split from cutting or dividing circuit board 111 into circuit board 111-1) disposed on a first edge 211-1 of the first circuit board 111-1 and second connector elements 213 (one or more connector elements 113 split from cutting circuit board 111 into circuit board 111-1) disposed on a second edge 211-2 of the first circuit board 111-1.

The first edge 211-1 (along axis C1) of assembly 211 is disposed substantially opposite the second edge 211-2 (along axis D1) on the first circuit board 111-1. The assembly 211 (such as apparatus) further includes, on a back facing shown, circuitry (such as circuitry 191-1, circuitry 192-1, one or more components 193-1, etc.) affixed to a back surface of the first circuit board 111-1 in a manner as previously discussed.

As further shown in FIG. 2, the second assembly 212 may include a circuit board 111-2. The circuit board 111-2 includes first connector elements 213 (one or more connector elements 113 split from cutting or dividing circuit board 111 into circuit board 111-2) disposed on a first edge 212-1 of the circuit board 111-2 and second connector elements 213 (one or more connector elements 113 split from cutting circuit board 111 into circuit board 111-2) disposed on a second edge 212-2 of the circuit board 111-2. The edge 212-1 (along axis E1) of assembly 212 is disposed substantially opposite the second edge 212-2 (along axis F1) on the circuit board 111-2. The assembly 212 (such as apparatus) further includes, on a first facing (such as back facing or surface), circuitry (such as circuitry 191-2, circuitry 192-2, one or more components 193-2, etc.) affixed to the circuit board 111-2 in a manner as previously discussed.

Thus, the circuit board 111 circuit board may be partitioned into multiple different circuit assemblies such as assembly 211, the assembly 212, etc.

Each of the first connector elements 213 on the first edge 211-1 of the first circuit board 111-1 may include a respective cavity as shown; each of the second connector elements 213 on the second edge of the circuit board 111-1 may include a respective cavity. Additionally, or alternatively, the connector elements 213 may be flat along a respective edge, protrude from the edge, etc.

As further shown, the fabricator creates slots S11, S12, etc., along a length of the edge of circuit board 111-1 as indicated by the axis C1. Each of the slots S11, S12, etc., (voids in the respective circuit board from front to back surfaces of same) is fabricated substantially orthogonal to the axis C1 and allows connectivity with another circuit board.

The fabricator 150 creates slots S21, S22, etc., along a length of the edge of circuit board 112-1 as indicated by the axis E1. Each of the slots S21, S22, etc., (voids in the respective circuit board) is fabricated substantially orthogonal to the axis E1 and allows connectivity with another circuit board.

Figure 3:
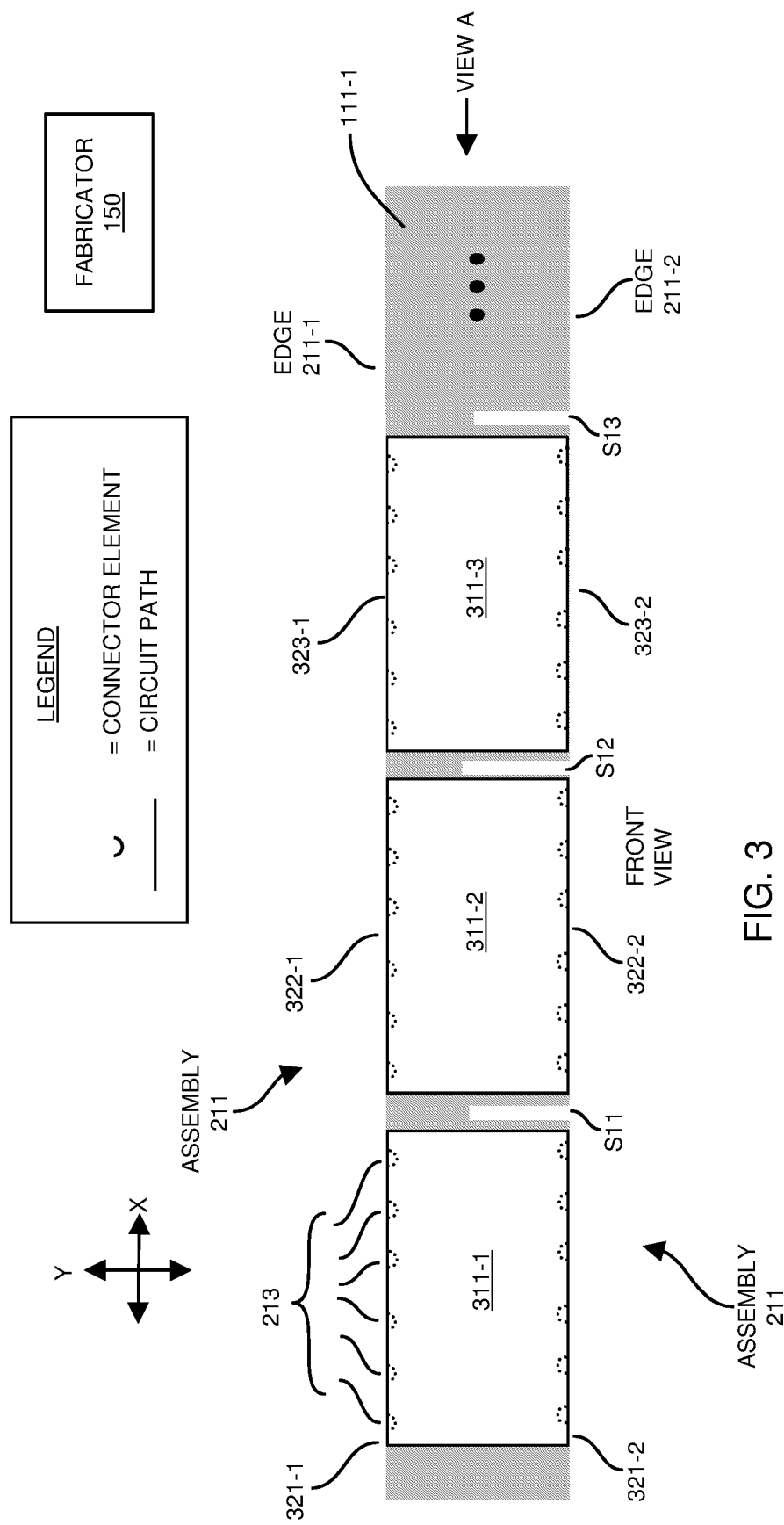
FIG. 3 is an example diagram illustrating a first assembly including alignment of axial ends of first circuitry to edges of a respective host circuit board as well as implementation of multiple slots to provide interlocking as described herein.

As further discussed herein, the fabricator 150 can be configured to affix additional circuitry on a second facing (front surface/facing and/or rear surface/facing) of each assembly as further discussed in FIG. 3. Thus, one or both surfaces of the respective circuit board can be populated with circuit components.

FIG. 3 is an example diagram illustrating a first assembly including alignment of axial ends of circuitry to edges of a respective host circuit board as described herein.

As previously discussed, each of the circuit board assemblies 211, 212, etc., can be fabricated to include circuit components and one or both sides. In this example, the circuit board assembly 211 includes first circuitry (such as circuitry 311-1, 311-2, 311-3, etc.) disposed on a first surface (such as front) of the first circuit board 111-1. As previously discussed, second circuitry (such as one or more of circuitry 191, 195, etc.) is disposed on a second surface (such as back) of the circuit board 111-1 of assembly 211.

In accordance with a further example, the fabricator 150 affixes circuitry (such as one or more circuit components 311-1, 311-2, 311-3, etc.) to the first surface of each of the circuit boards 111-1, 112-1, etc.

More specifically, as shown in FIG. 3, the fabricator 150 affixes each instance of the circuitry 311 to the first (front) surface of the circuit board 111-1. In this example, the first edge 211-1 of the first circuit board 111-1 is aligned with a first axial end 321-1 of the first circuitry 311-1 and the second edge 211-2 of the first circuit board 111-1 aligns with a second axial end 321-2 of the first circuitry 311-1. As further discussed herein, this facilitates connectivity of the assembly 212 to a respective host circuit substrate. Alignment facilitates interconnectivity of the assemblies to other circuit boards.

Similarly, the fabricator 150 affixes the circuitry 311-2 to the first surface of the circuit board 111-1. In this example, the first edge 211-1 of the first circuit board 111-1 aligns with a first axial end 322-1 of the circuitry 311-2 and the second edge 211-2 of the circuit board 111-1 aligns with a second axial end 322-2 of the circuitry 311-2.

Yet further, the fabricator 150 affixes the circuitry 311-3 to the second surface of the circuit board 111-1. In this example, the first edge 211-1 of the first circuit board 111-1 aligns with a first axial end 323-1 of the circuitry 311-3 and the second edge 211-2 of the circuit board 111-1 aligns with a second axial end 323-2 of the circuitry 311-3.

In this manner, the fabricator 150 can be configured to affix and align any circuitry on the front or back facing (surface) of the circuit board 111-1 with respective edges.

Thus, each of the front and back surfaces associated with the circuit board 111-1 may be populated with one or more circuit components. For example, first circuitry (such as circuitry 311-1, circuitry 311-2, circuitry 311-3, etc.) may be affixed to a first surface of the first circuit board 111-1; one or more supplemental circuit components (such as circuitry 191-1, 191-2, 195-1, 195-2, etc.) may be coupled to a second surface of the first circuit board 111-1. The second surface is disposed substantially opposite the first surface.

As previously discussed, each of the assemblies 211, 212, etc., includes a sequence of slots S11, S12, etc., disposed along the Y-axis orthogonal to the edges 211-1, 211-2, etc. The slots supporting interlocking of a respective circuit boards/assemblies.

Figure 4:
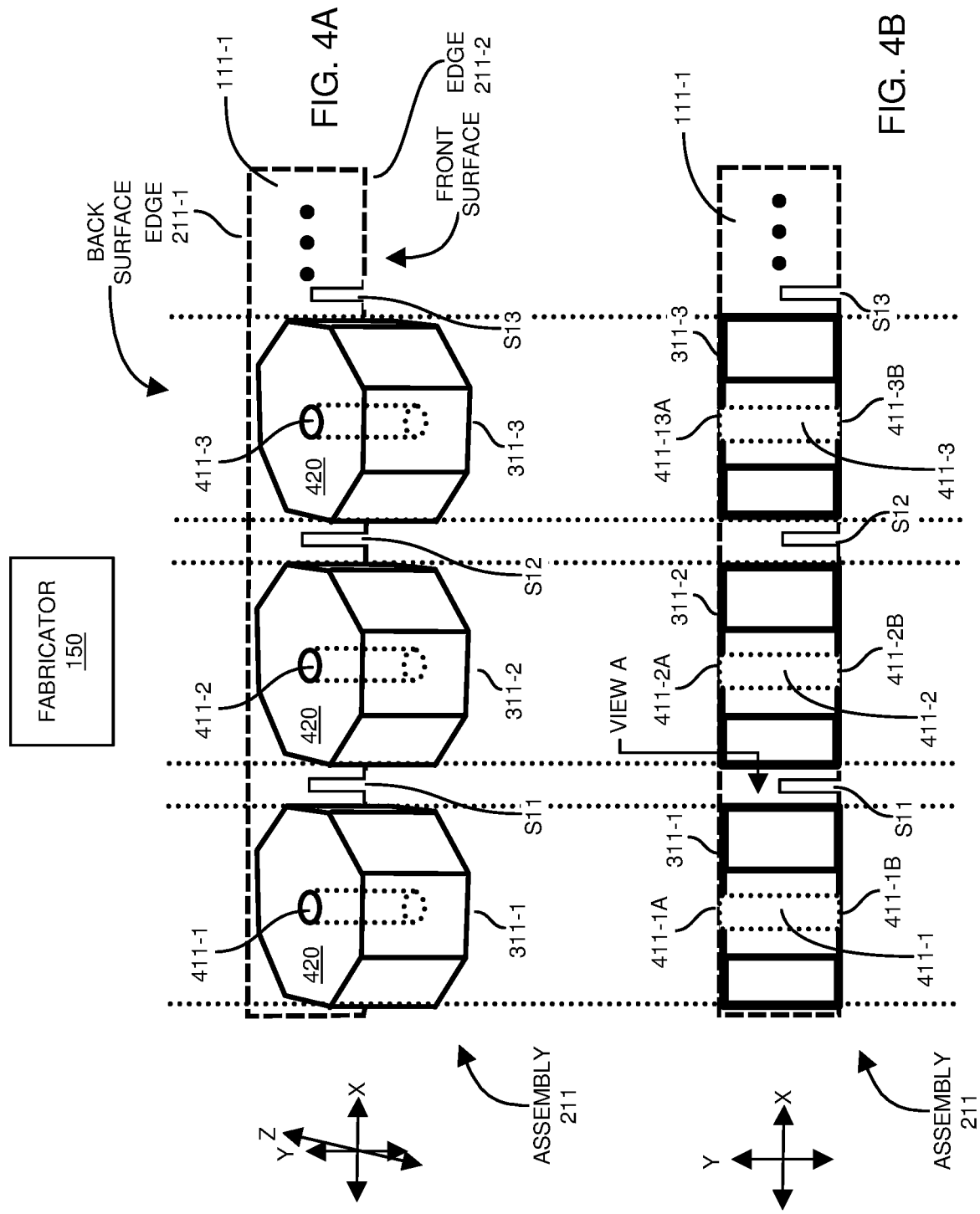
FIGS. 4A and 4B are example diagrams illustrating fabrication of the first assembly to include multiple inductor devices affixed to a respective circuit substrate as discussed herein.

FIG. 4A is an example 3-D diagram illustrating fabrication of the first assembly to include multiple inductor devices affixed to a respective circuit substrate as discussed herein. FIG. 4B is an example side view diagram illustrating fabrication of the first assembly to include multiple inductor devices affixed to a respective circuit substrate as discussed herein.

In this example, the fabricator 150 affixes the inductor device 311-1 (such as an instance of the circuitry 311-1 as previously discussed) to a front face (first surface) of the circuit board 111-1 as shown. The inductor device 311-1 includes an electrically conductive path 411-1 surrounded by magnetic permeable material 420.

More specifically, the first circuitry 311 affixed to the first circuit board 111-1 may be implemented as an inductor device 311-1. The inductor device 311-1 may be fabricated to include an electrically conductive path 411-1 extending through a core of the magnetic permeable material 420. As shown in FIG. 4B, the electrically conductive path 411-1 may be electrically conductive material (such as metal) extending between the first axial end 411-1A of the inductor device 311-1 and the second axial end 411-1B of the inductor device 311-1. As shown in both FIGS. 4A and 4B, the electrically conductive path 411-1 of the inductor device 311-1 may be enveloped by the magnetic permeable material 420 between the first axial end 411-1A and the second axial end 411-1B.

Note that the electrically conductive path 411-1 may be implemented as a cylindrical body (or other suitable shape) of material fabricated from the electrically conductive material such as metal.

The circuitry 311-2 affixed to the first circuit board 111-1 via fabricator 150 may be implemented as an inductor device (311-2). The inductor device (311-2) may be fabricated to include an electrically conductive path 411-2 and magnetic permeable material 420. The electrically conductive path 411-2 may be electrically conductive material (such as metal) extending between the first axial end 411-2A of the inductor device 311-2 and the second axial end 411-2B of the inductor device 311-2; the electrically conductive path 411-2 of the inductor device 311-2 may be enveloped by the magnetic permeable material 420 between the first axial end 411-2A and the second axial end 411-2B.

Note that the electrically conductive path 411-1 may be implemented as a cylindrical body of material or other suitable shape fabricated from the electrically conductive material such as metal.

The circuitry 311-3 affixed to the first circuit board 111-1 may be implemented as an inductor device (311-3). The inductor device may be fabricated to include an electrically conductive path 411-3 and magnetic permeable material 420. The electrically conductive path 411-3 may be electrically conductive material (such as metal) extending between the first axial end 411-3A of the inductor device 311-3 and the second axial end 411-3B of the inductor device 311-3; the electrically conductive path 411-3 of the inductor device 311-3 may be enveloped by the magnetic permeable material 420 between the first axial end 411-3A and the second axial end 411-3B.

Note that the electrically conductive path 411-3 may be implemented as a cylindrical body (or other suitable shape) of material fabricated from the electrically conductive material such as metal.

In a similar manner, the fabricator 150 can be configured to affix any number of the inductor devices to a respective circuit board to produce a sub-assembly 211.

Other sub-assemblies such as assembly 212, assembly 213, assembly 214, etc., are fabricated in a similar manner as assembly 211 and may include identical features as assembly 211. Such assemblies are the building blocks of other assemblies as discussed herein.

As previously discussed, the respective assembly 211 and corresponding circuit board 111-1 include slots S11, S12, S13, etc., to provide connectivity with other circuit boards.

Figure 5:
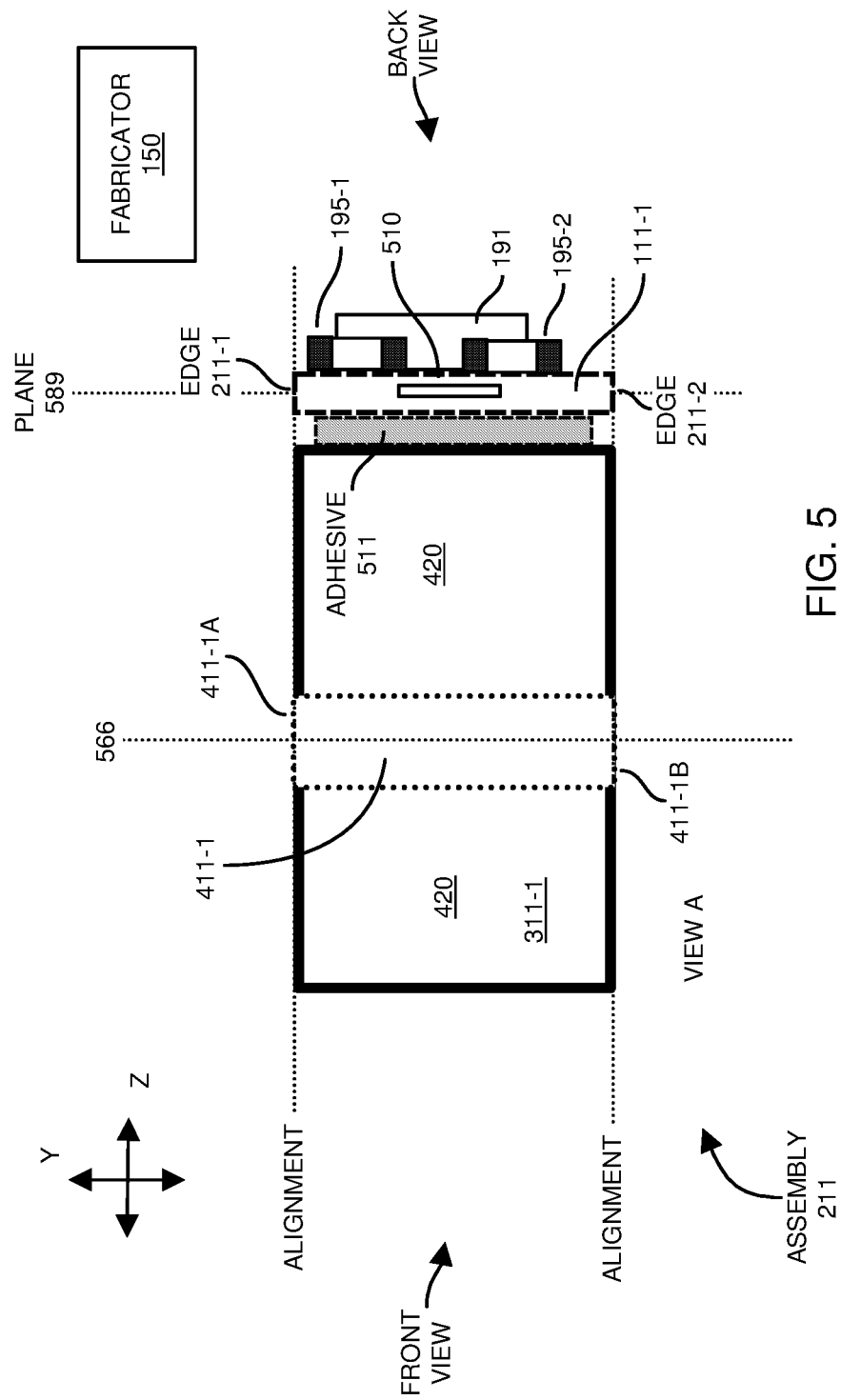
FIG. 5 is an example side view diagram illustrating a circuit assembly including a sequence of one or more inductor devices as described herein.

FIG. 5 is an example side view diagram illustrating a circuit assembly and alignment as described herein. Note that the view of assembly in FIG. 5 is cross-section view A is from a perspective shown in FIG. 4B along a length of the circuit board 111-1.

As shown in FIG. 5, the assembly 211 may include one or more circuits 510 such as sub-circuits (such as semiconductor chips, discrete components, etc.) embedded in the circuit board 111-1. Additionally, or alternatively, the one or more semiconductor chips, discrete components, etc., are affixed to a surface of the circuit board 111-1.

As further shown, the center of the electrically conductive path 411-1 through inductor device (such as circuitry 311-1) is disposed along axis 566. The axis 556 may be disposed along a length at center of the body 411-1 (such as cylindrical) between the first axial end 411-1A and the second axial end 411-1B. The axis 556 may be substantially parallel to a plane 589 in which the circuit board 111-1 resides.

The circuitry 311-1 such as an inductor device may be affixed to the circuit board 111-1 in any suitable manner. For example, the apparatus (one or more assemblies) as discussed herein may further include a layer of material such as adhesive 511 disposed between the magnetic permeable material 420 or surface of the circuitry 311-1 (such as inductor device) and a surface of the circuit board 111-1. The layer of material (adhesive 511) affixes the inductor device 311-1 to the circuit board 111-1. Any components are affixed to a front or back surface of the circuit board 111-1 as previously discussed.

Figure 6:
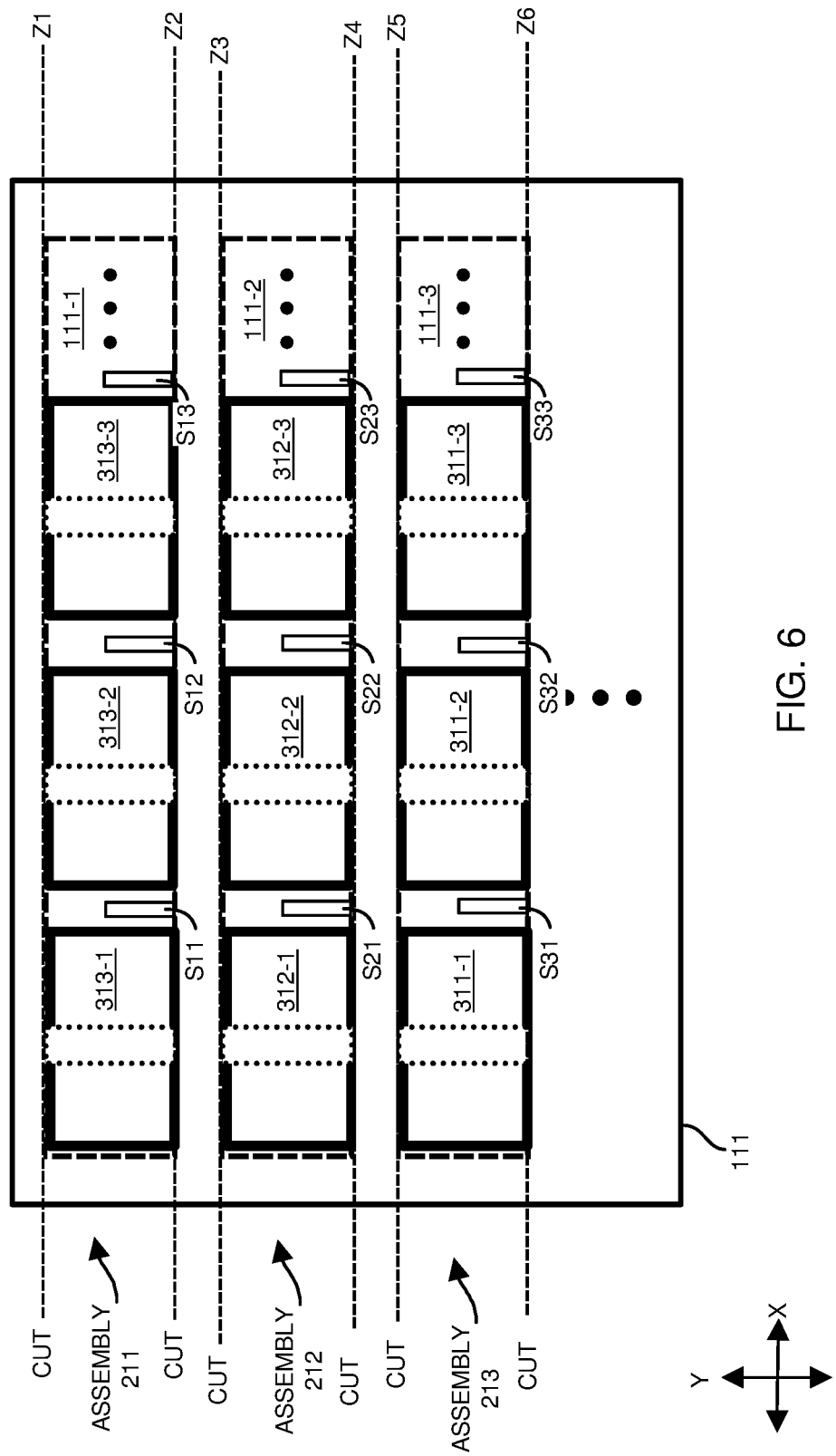
FIG. 6 is an example top view diagram illustrating fabrication of multiple subassemblies from a circuit substrate populated with inductor devices as described herein.

FIG. 6 is an example top view diagram illustrating fabrication of multiple subassemblies from a circuit substrate populated with inductor devices as described herein.

The inductor devices as described herein can be affixed to a respective surfaces of the circuit boards in any suitable time. In certain instances, the fabricator 150 produces the circuit boards without any inductor device or other components affixed to it.

In this example, the inductor devices are affixed to a respective surface of the circuit board 111 prior to the fabricator 150 making planar cuts along plane Z1, plane Z2, plane Z3, plane Z4, plane Z5, plane Z6, etc. Implementation of the planar cuts may ensure the alignment of the edges of the circuit boards with the corresponding circuitry affixed to the circuit board in a manner as discussed herein. This facilitates connectivity of the circuitry with respect to one or more substrates to which the circuitry such as inductor devices may be attached.

For example, via the cuts, first axial ends of circuitry 311-1, 311-2, 311-3, etc., may align along edge of circuit board 111-1 along axis Z1; second axial ends of circuitry 311-1, 311-2, 311-3, etc., align along edge of circuit board 111-1 along axis Z2.

Via cuts, first axial ends of circuitry 312-1, 312-2, 312-3, etc., align along edge of circuit board 111-2 along axis Z3; second axial ends of circuitry 312-1, 312-2, 312-3, etc., align along edge of circuit board 111-2 along axis Z4.

Via cuts, first axial ends of circuitry 313-1, 313-2, 313-3, etc., align along edge of circuit board 111-3 along axis Z5; second axial ends of circuitry 313-1, 313-2, 313-3, etc., align along edge of circuit board 111-3 along axis Z6.

Thus, respective assemblies 211, 212, 213, etc., can be fabricated in any suitable manner.

As previously discussed, the fabricator 150 can be configured to produce slots along a length of the different assemblies/circuit boards as shown.

Figure 7:
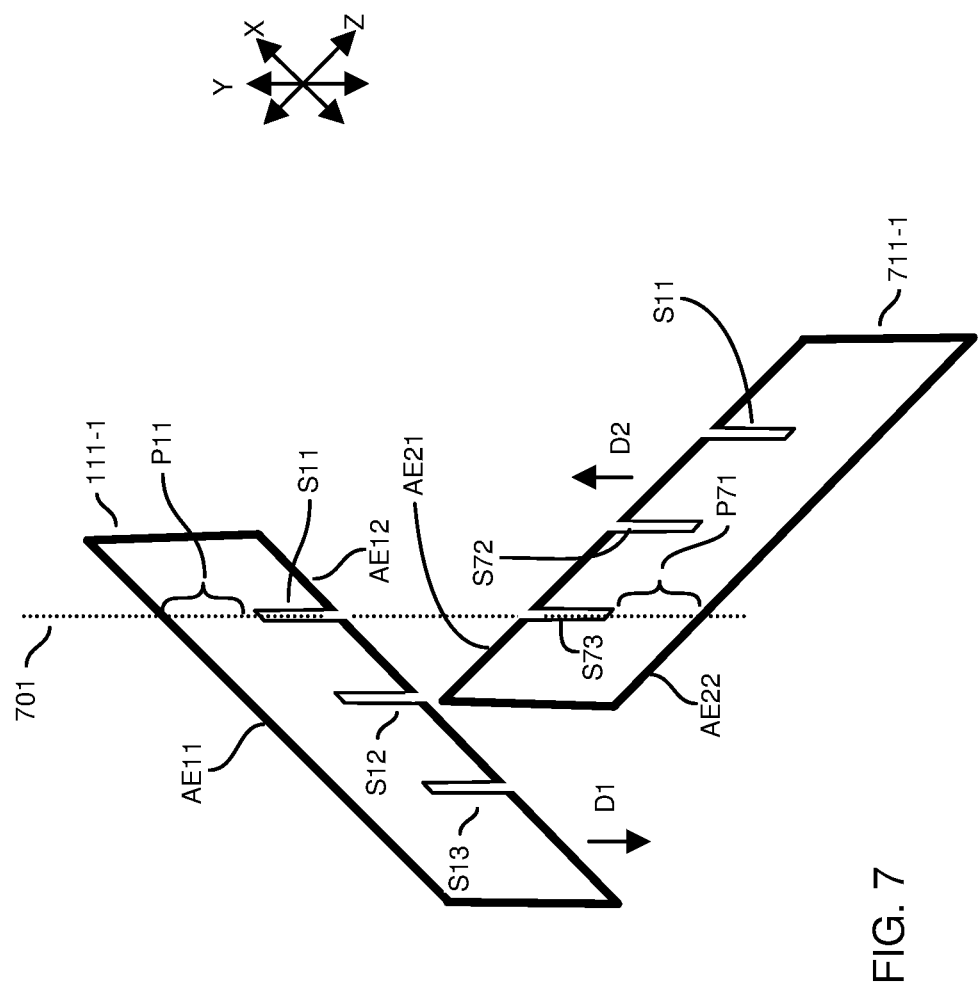
FIG. 7 is an example three-dimensional view diagram illustrating alignment for subsequent interlocking of multiple sub-assemblies as described herein.

FIG. 7 is an example three-dimensional view diagram illustrating alignment for subsequent interlocking of multiple sub-assemblies as described herein.

As previously discussed, each of the respective circuit boards 111-1 (a.k.a., assembly 211), 112-1 (a.k.a., assembly 212), etc., may be populated with respective components on one or both sides prior to connectivity as shown in FIG. 7 and subsequent drawings. This example illustrates connectivity of the circuit boards with respect to each other along the axis 701.

For example, to provide interlocking of the circuit board 111-1 to the circuit board 711-1, the fabricator 150 aligns the slot S11 (e.g., opening, void, etc.) on the circuit board 111-1 to the slot S73 disposed on the circuit board 111-1. The first slot S11 extends through a less-than-all length of the circuit board 111-1 starting from the first axial end AE11 of the first circuit board 111-1 towards the second axial end AE12 of the first circuit board 111-1. There is no slot in the portion P11 of the circuit board 111-1.

The slot S73 (e.g., opening, void, etc.) extends through a less-than-all length of the second circuit board 711-1 starting from the first axial end AE21 of the circuit board 711-1 towards the second axial end AE22 of the circuit board 711-1. There is no slot in the portion P71 of the circuit board 711-1.

Eventually, the fabricator 150 moves the circuit board 111-1 (down) and/or circuit board 711-1 (*up*) along the axis 701 to provide interconnectivity of the two circuit boards such that: i) a portion P71 of the circuit board 711-1 resides within the slot S11 of the circuit board 111-1, and ii) a portion P11 of the circuit board 111-1 resides within the slot S73 of the circuit board 711-1.

Figure 8:
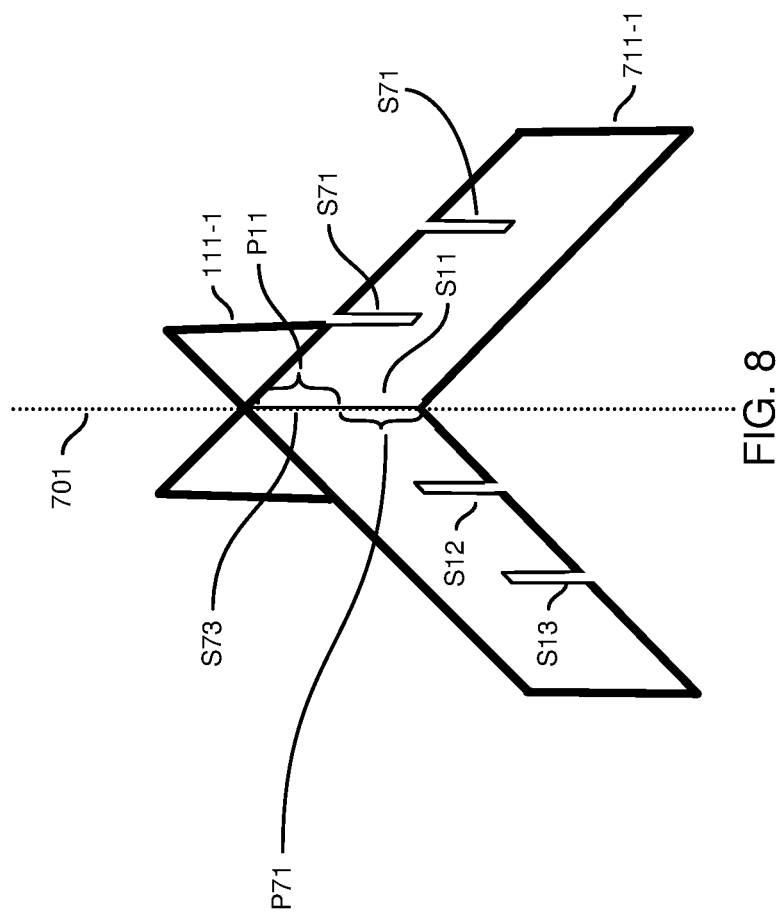
FIG. 8 is an example three-dimensional view diagram illustrating multiple interlocked sub-assemblies as described herein.

As further shown in FIG. 8, subsequent to interlocking as discussed in FIG. 7, the circuit board 111-1 is interlocked with the circuit board 711-1 via interlocking provided by a combination of the slot S11 and the slot S71.

FIG. 8 is an example three-dimensional view diagram illustrating multiple interlocked sub-assemblies as described herein.

In this example, as previously discussed, subsequent to interlocking, a first portion P11 of the first circuit board 111-1 resides within the slot S73 of the circuit board 711-1. A first portion P71 of the circuit board 711-1 resides within the slot S11 of the circuit board 111-1.

Thus, techniques herein may include interlocking of circuit boards provided by a combination of the slot S11 and the slot S73. As further shown, note that the circuit board 111-1 is disposed non-parallel to the circuit board 711-1.

Figure 9:
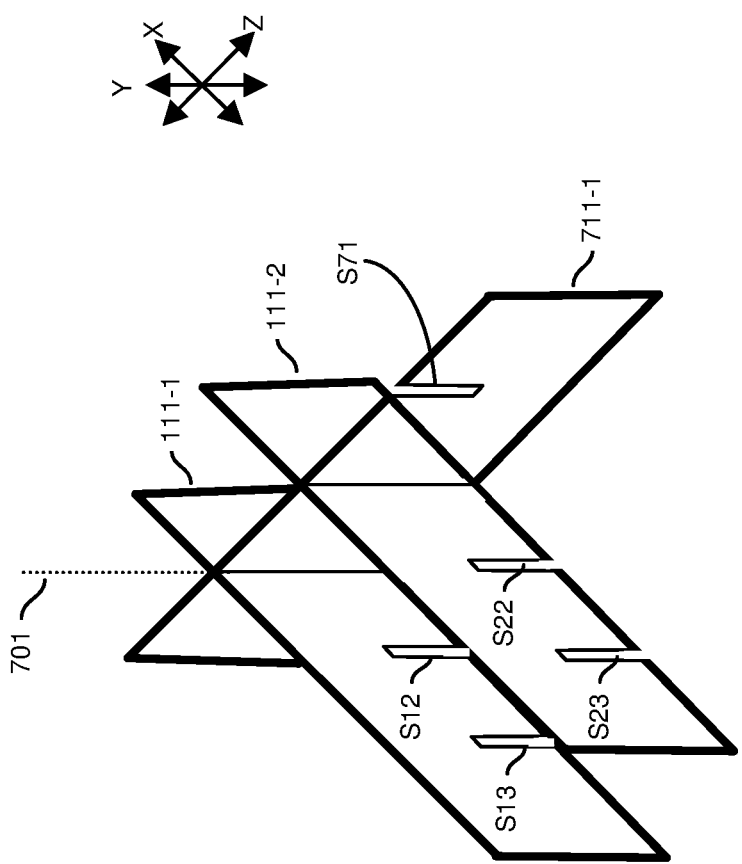
FIG. 9 is an example three-dimensional view diagram illustrating multiple interlocked sub-assemblies as described herein.

FIG. 9 is an example three-dimensional view diagram illustrating multiple interlocked sub-assemblies as described herein.

In this example, the fabricator 150 interlocks the circuit board 111-2 with circuit board 711-1 in a similar manner as previously discussed. Circuit board 111-2 is disposed in parallel with circuit board 111-1. Each of the circuit boards 111-1 and 111-2 is disposed orthogonal to board 711-1.

Figure 10:
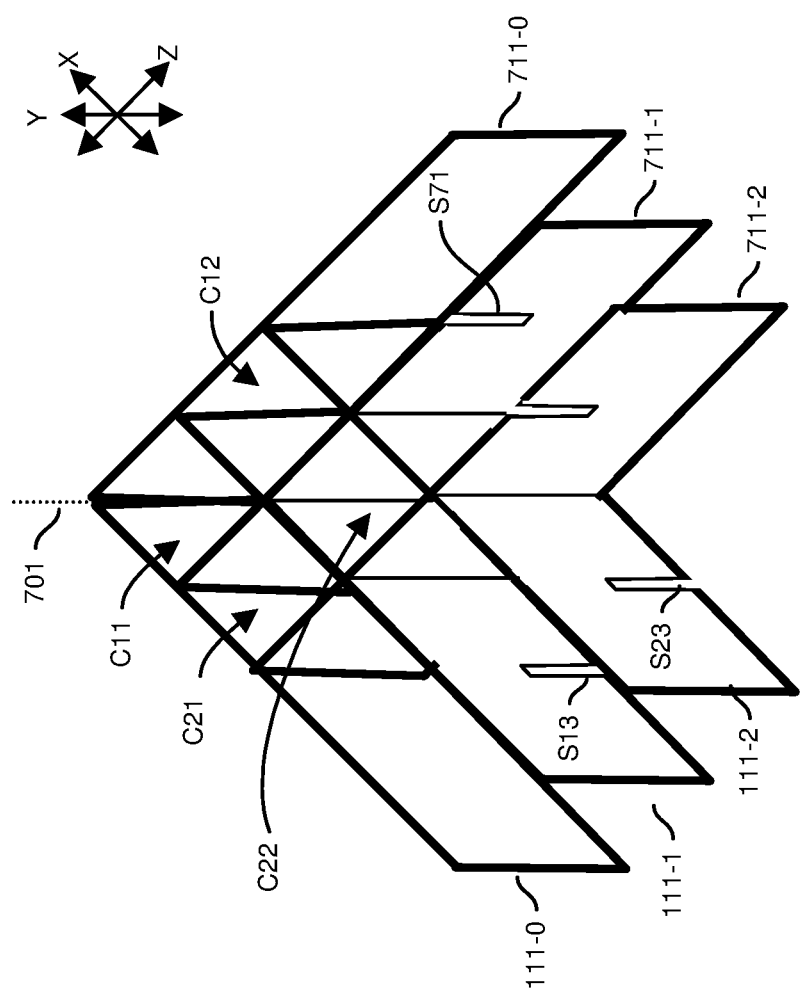
FIG. 10 is an example three-dimensional view diagram illustrating multiple interlocked sub-assemblies as described herein.

FIG. 10 is an example three-dimensional view diagram illustrating multiple interlocked sub-assemblies as described herein.

In this example, the fabricator 150 interlocks the circuit board 711-2 with other circuit boards as shown in FIG. 10.

Circuit boards 111-0, 111-1, 111-2 are disposed in parallel with each other. Circuit boards 711-0, 711-1, 711-2 are disposed in parallel with each other. The circuit board 111-1 is in contact with and interlocked with the circuit board 711-1 and the circuit board 711-2 but not the circuit board 111-2. The circuit board 711-2 is in contact with and interlocked with the circuit 111-1 board and the circuit board 111-2 but not the circuit board 711-1.

Circuit boards 111-0 and 711-0 provide outer surfs of the assembly in FIG. 10. If desired, the circuit board 111-0 can be interlocked with circuit boards 711-1, 711-2, . . . , as discussed herein. The circuit board 711-0 can be interlocked with circuit boards 111-1, 111-2, as discussed herein.

The interlocking of circuit boards produces cavities C11, C12, . . . , C21, C22, . . . , in which to house one or more circuit components such as including an inductor device. For example, a combination of the circuit board 111-1, the circuit board 711-1, the circuit board 111-2, and the circuit board 711-2, encloses a volume (cavity C22) in which a respective inductor device resides.

Figure 11:
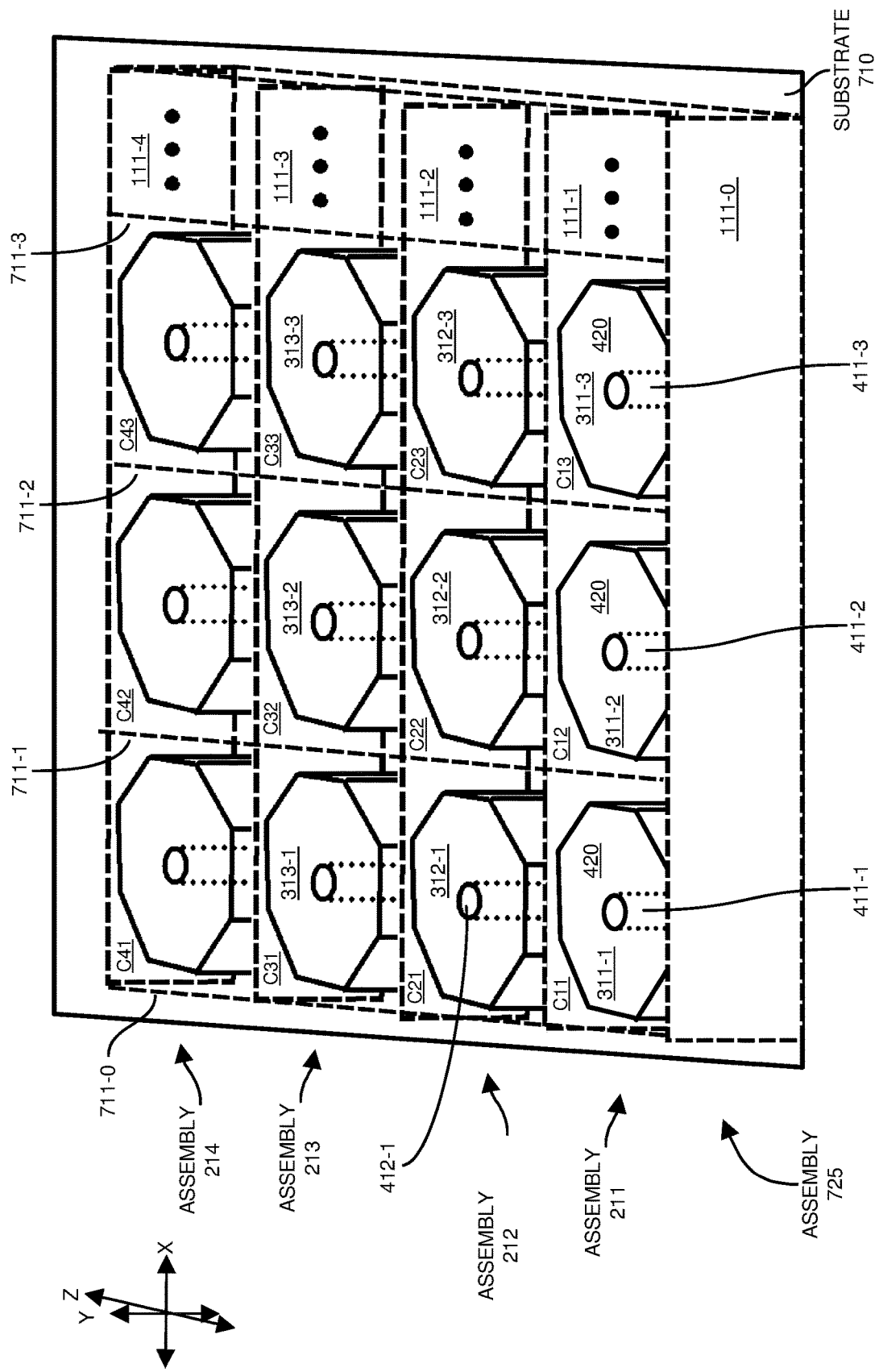
FIG. 11 is an example three-dimensional view diagram illustrating population of a substrate with multiple interlocked assemblies as described herein.

FIG. 11 is an example three-dimensional view diagram illustrating population of interlocked assemblies on one or more substrate as described herein.

In this example, the assemblies 211, 212, 213, and 214 are disposed in parallel and are coupled to the substrate 710 (such as a planar substrate). As previously discussed, each of the circuit boards 111-1, 111-2, 111-3, 111-4, etc., is interlocked with each of the circuit boards 711-1, 711-2, 711-2, etc. The fabricator 150 can be configured to produce the assembly 725 to include a second substrate (such as a planar substrate 810 in other drawings) on a top surface of the assembly 725. See further figures showing a side view of multiple assemblies (211, 212, etc.) sandwiched between the substrate 710 and substrate 810.

As previously discussed, and as shown in FIG. 11, the assembly 725 includes: i) multiple slotted primary circuit boards (assemblies 211, 212, 213, and 214 such as circuit boards 111-1, 111-2, 111-3, 111-4) spaced apart from each other and disposed substantially parallel to each other; ii) multiple slotted secondary circuit boards (such as circuit boards 711-1, 711-2, 711-3, 711-4) spaced apart from each other and disposed substantially parallel to each other; and iii) a combination of the slots of the multiple slotted primary circuit boards (associated with each of the circuit board 111-1, 111-2, 111-3, and 111-4) and slots in the multiple slotted secondary circuit boards (associated with each of the circuit board 711-1, 711-2, 711-3, and 711-4) interlock the multiple slotted primary circuit boards and the multiple slotted secondary circuit boards.

More specifically, each of the multiple slotted primary circuit boards (111-1, 111-2, 111-3, 111-4) includes a respective first slot; each of the multiple slotted secondary circuit boards (711-1, 711-2, 711-3, and 711-4) includes a respective second slot; portions of the multiple slotted primary circuit boards reside in the respective second slots of the multiple slotted secondary circuit boards; and portions of the multiple slotted secondary circuit boards reside in respective first slots of the multiple slotted primary circuit boards.

As further shown, the interlocking of respective circuit boards (assemblies) results in creation of cavities in which the inductor devices reside. For example, as shown, respective surfaces of circuit board 111-1, circuit board 711-0, circuit board 111-0, and circuit board 711-1 produce the cavity C11 (such as volume, space, etc.) in which the inductor device 311-1 resides; respective surfaces of circuit board 111-1, circuit board 711-1, circuit board 111-0, and circuit board 711-2 produce the cavity C12 (such as volume, space, etc.) in which the inductor device 311-2 resides; respective surfaces of circuit board 111-1, circuit board 711-2, circuit board 111-0, and circuit board 711-3 produce the cavity C13 (such as volume, space, etc.) in which the inductor device 311-3 resides; . . . ; respective surfaces of circuit board 111-2, circuit board 711-0, circuit board 111-1, and circuit board 711-1 produce the cavity C21 (such as volume, space, etc.) in which the inductor device 312-1 resides; respective surfaces of circuit board 111-2, circuit board 711-1, circuit board 111-1, and circuit board 711-2 produce the cavity C22 (such as volume, space, etc.) in which the inductor device 312-2 resides; respective surfaces of circuit board 111-2, circuit board 711-2, circuit board 111-2, and circuit board 711-3 produce the cavity C23 (such as volume, space, etc.) in which the inductor device 312-3 resides; and so on.

Accordingly, the assembly 725 includes multiple cavities defined by respective surfaces of the multiple interlocked slotted primary circuit boards (111-1, 111-2, 111-3, 111-4) and surfaces of the multiple slotted secondary circuit boards (711-1, 711-2, 711-3, 711-4).

Figure 12:
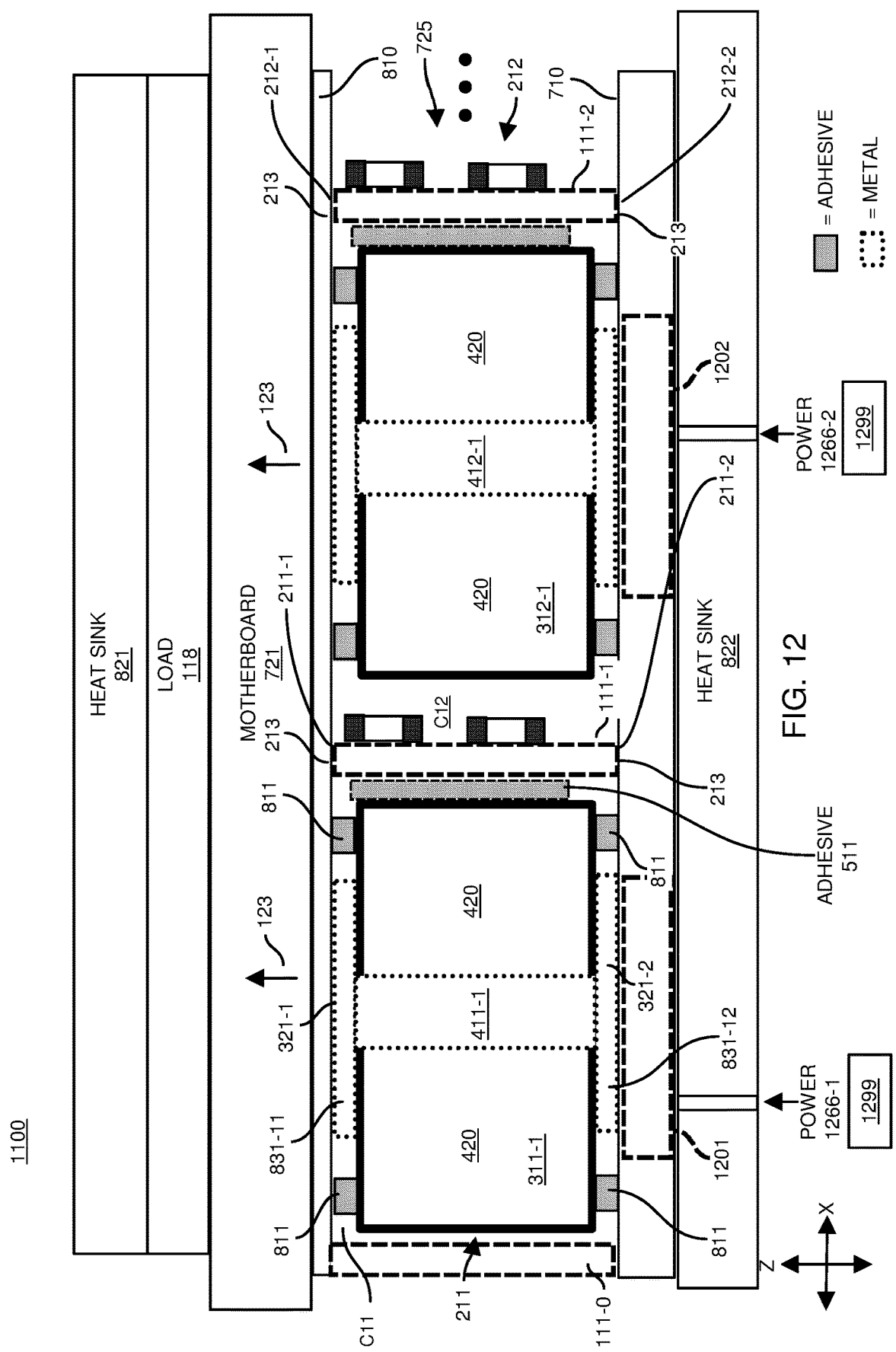
FIG. 12 is an example diagram illustrating implementation of multiple interlocked subassemblies in a power delivery system as described herein.

As further shown in FIG. 12, note that the assembly 725 can include the multiple primary circuit boards (111-0, 111-1, 111-2, etc.) interlocked with secondary circuit boards (711-0, 711-1, 711-2, etc.) and disposed between substrate 710 and a top substrate 810. The assembly or combination of interlocked circuit boards resides between a first circuit substrate 710 and a second circuit substrate 810. As further shown, a first axial end of each inductor is coupled to the first circuit substrate 710 and a second axial end of each inductor is coupled to the second circuit substrate 810.

FIG. 12 is an example diagram illustrating implementation of multiple subassemblies in a power delivery system as described herein.

In general, the assembly 725 (interlocked circuit boards) in FIG. 11 resides between substrate 710 and substrate 810 as shown in FIG. 12. The system 1100 includes multiple power converter phases, portions of which are disposed between substrate 710 and substrate 810 to provide power to a load 118. For example, circuitry 1201 (such as a first power converter phase) resides in one or more locations such as embedded in the substrate 710, disposed on one or more surfaces of the substrate 710, etc. The circuit 1201 can be configured to include power converter circuitry (1121) such as one or more of controller, drivers, switches, etc.

Circuitry 1202 (such as circuitry associated with a second power converter phase) resides in one or more locations such as embedded in the substrate 710, disposed on one or more surfaces of the substrate 710, etc. The circuit 1202 can be configured to include power converter circuitry (1122) such as one or more of controller, drivers, switches, etc. See an example in FIG. 13.

Referring again to FIG. 12, thus, each cavity and corresponding power converter phase circuitry on the substrate 710 or circuit boards of assembly 725 can be configured to provide power to receive power from the power supply 1299 through heat sink 822. Each power converter phase and corresponding cavity of circuitry provides one phase of power. More specifically, power converter phase (1201) and inductor device 311-1 in cavity C11 provides respective current and an output voltage 123 to power the load 118; power converter phase (1202) and inductor device 312-1 in cavity C21 provides respective current and an output voltage 123 to power the load 118; and so on. Each of the power converters may be disposed in parallel to produce the output voltage 123.

Referring again to FIG. 12, in this example, the assembly 1200 includes the first assemblies (211, 212, etc.) as previously discussed as well as a first substrate 710 and a second substrate 810. Each of the assemblies is fabricated in a similar manner.

The first connector elements 213 on the first edge 211-1 of the first assembly 211 may be connected to nodes of the substrate 810; the first axial end of the electrically conductive path 411-1 associated with the first circuitry 311-1 such as first inductor device may be connected to a node of the substrate 810 via electrically conductive path 831-11 (such as solder or other suitable material); the second connector elements 213 on the second edge 211-2 may be connected to respective nodes of the substrate 710; the second axial end of the first circuitry such as inductor device 311-1 may be connected to a respective node of the substrate 710 via electrically conductive path 831-12 (such as solder or other suitable material). As previously discussed, circuit paths 193-1, etc., provide connectivity between nodes of the substrate 710 and nodes of the substrate 810 such that circuitry on substrate 710 is able to transmit or receive signals from the circuitry or other components associated with substrate 810.

Note further that the circuit board 710 may reside in a first plane; the circuit board 810 may reside in a second plane. Yet further, note that the substrate 710 may be disposed substantially parallel to the substrate 810; the circuit board 111-0, circuit board 111-1, circuit board 111-2, etc., may be disposed substantially in parallel with each other; and planar surfaces of the circuit board 110-0, circuit board 111-1 the circuit board 111-2, etc., may be disposed substantially orthogonal to the substrate 810 and/or the substrate 710.

The inductor device 311-1 optionally includes electrically conductive path 831-11 (such as extra metal material) disposed at axial end 321-1 and electrically conductive path 831-12 (such as extra metal material) disposed at axial end 321-2. Thus, the cross sectional areas/regions of the electrically conductive path (combination of electrically conductive path 411-1, electrically conductive path 831-11, and electrically conductive path 831-12) may be enlarged at the first axial end 321-1 and the second axial end 321-2 with respect to a cross sectional area of the electrically conductive path 411-1 at a location between the first axial end and the second axial end of the inductor device. In other words, in the side view shown, the electrically conductive path 831-11 and electrically conductive path 831-12 is wider than the electrically conductive path 411-1.

Each of the electrically conductive paths 411-1, 411-2, 411-3, . . . , 412-1, 412-2, 412-3, can be configured to supply respective current and a corresponding output voltage 123 to the load 118 and/or motherboard 721.

Components 195-1, 195-2, etc., such as capacitors can be configured to store the output voltage and/or input voltage associated with respective power converter circuitry.

A combination of the first edge 211-1 of the circuit board 111-1, the first axial end 321-1 of the inductor device (circuitry 311-1), the first edge 212-1 of the circuit board 111-2, first axial end of the inductor device (circuitry 312-1) may reside in a first plane and coupled to planar surface of the circuit board 810; a combination of the second edge 211-2 of the circuit board 111-1, the second axial end 321-2 of the inductor device (circuitry 311-1), the second edge 212-2 of the circuit board 111-2, second axial end of the inductor device (circuitry 312-1) may reside in a second plane and coupled to planar surface of the circuit board 710.

The first plane may be disposed substantially parallel to the second plane. For example, the bottom surface of the substrate 810 resides in the first plane and is in contact with the assemblies 211, 212, etc., and corresponding components. The top surface of the substrate 710 resides in the second plane and is in contact with the assemblies 211, 212, etc., and corresponding components.

The circuit substrate 701 may be substantially parallel (such as within several degrees) to the circuit substrate 801; and the primary circuit boards (111-1, 111-2, 111 3, 111-4) and the secondary circuit boards (711-1, 711-2, 711-3, 711-4) in assembly 725 are disposed substantially orthogonal to the circuit substrate 710 and the circuit substrate 810.

A respective inductor device disposed between respective power converter circuit (such as circuit 1201, 1202, etc.) and the circuit board substrate 810 is operative to convey current from the power converter circuit to the load 118. Via traces 193-1 or the like, one or more of the respective circuit boards (111-1, 111-2, 111-3, 111-4, . . . , 711-1, 711-2, 711-3, 711-4) provides a return current path from the load 118 to a reference potential associated with the power converter circuit.

The power 1266-1, 1266-2, etc., from power supply 1299 may include an input voltage V1 from a source 120-1. The one or more components 195-1 disposed on the circuit board 111-1 may be first capacitors on the circuit board 111-1 that store the input voltage V1; the one or more components 195-2 may be second capacitors disposed on the circuit board 111-1 or circuit board 711-1, which provide storage of the output voltage 123 generated by a respective power converter phase. As previously discussed, the power converter phase 1201 and inductor device 311-1 convert the input voltage V1 into the output voltage 123. See also FIG. 13.

Referring again to FIG. 12, yet further, the edge contact (such as edge 211-1) of connector elements 213 disposed on a first axial end 321-1 of the circuit board 111-1 connects the circuit board 111-1 to the substrate 810; edge contact (such as edge 211-2) of connector elements 213 disposed on a second axial end 321-2 of the circuit board 111-1 connects the circuit board 111-1 to the substrate 710; as previously discussed, the circuit board 111-1 provides electrical connectivity between the first edge contact (211-1) and the second edge contact (211-2).

In a similar manner, the edge contact (such as edge 212-2) of connector elements 213 disposed on a first axial end of the circuit board 111-2 connect the circuit board 111-2 to the substrate 810; edge contact (such as edge 212-2) of connector elements 213 disposed on a second axial end of the circuit board 111-2 connect the circuit board 111-2 to the substrate 710; as previously discussed, the circuit board 111-2 provides electrical connectivity between the first edge contact (212-1) and the second edge contact (212-2).

Figure 13:
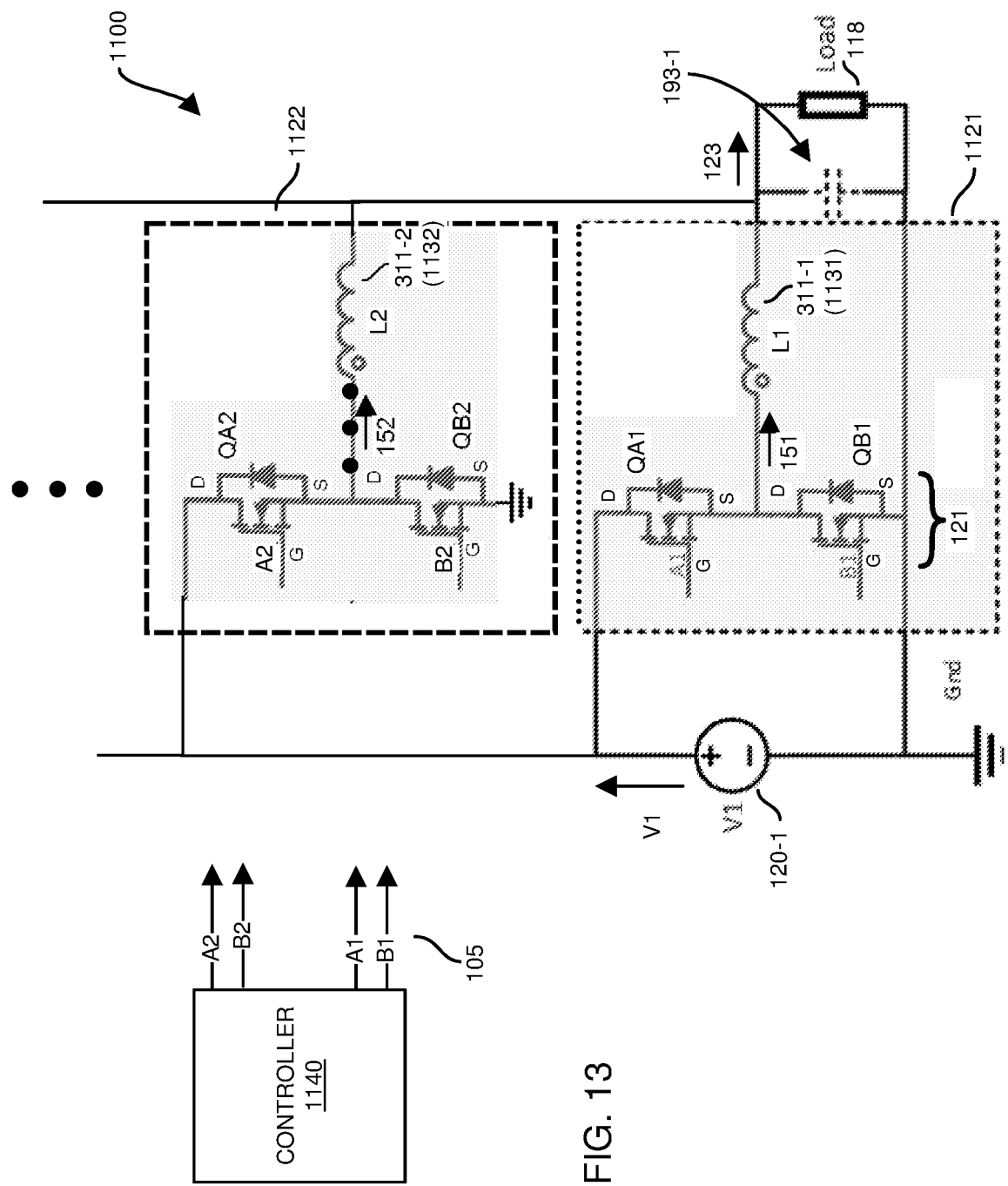
FIG. 13 is an example diagram illustrating connectivity of circuit components in a power supply including one or more inductor devices as discussed herein.

FIG. 13 is an example diagram illustrating connectivity of circuit components in a power supply including one or more assemblies and corresponding inductor devices as discussed herein.

In this non-limiting example, the power supply 1100 includes controller 1140 and multiple phases 1121 and 1122 that collectively generate a respective output voltage 123 (and/or output current) to power load 118 based on current through one or more inductive paths 1131, 132, etc., such as inductor devices 311-1 (a.k.a., 1131), 311-2 (a.k.a., 1132), etc. The load 118 can be any suitable circuit such as CPUs (Central Processing Units), GPUs and ASICs (such those including one or more Artificial Intelligence Accelerators), etc., which can be located on standalone circuit board.

Note that power supply 1100 can include any number of phases. If desired, the phases can be split such that the first phase 1121 powers a first load independent of the second phase 1122 powering a second load. Alternatively, the combination of phase 1121 and phase 1122 drive the same load 118 as shown in FIG. 13.

As further shown in FIG. 13, a combination of the phase 1121 and phase 1122 (and any of multiple additional power converter phases in the assembly 725, circuit 1100, etc.) power the same load 118. Phase 1121 includes series connection of switch QA1, switch QB1, and inductive path 1131 such as circuitry 311-1 (such as one or more inductor devices). Phase 1122 includes series connection of switch QA2, switch QB2, and inductive path 1132 such as circuitry 311-2 (such as one or more inductor devices).

Further in this example, the voltage source 120-1 supplies voltage V1 (such as 6 VDC or any suitable voltage) to the series combination of switch QA1 (such as a high-side switch) and switch QB1 (such as a low-side switch).

The combination of switches QA1 and QB1 as well as inductive path 1131 may operate in accordance with a buck converter topology to produce the output voltage 123.

Further in this example, note that the drain node (D) of switch QA1 is connected to receive voltage V1 provided by voltage source 120-1. The source node (S) of switch QA1 is coupled to the drain node (D) of switch QB1 as well as the input node of inductive path 1131 (inductor device 311-1). The source node of switch QB1 is coupled to ground. The output node of the inductive path 1131 is coupled to the load 118.

The combination of switches QA2 and QB2 as well as inductive path 1132 may operate in accordance with a buck converter topology to produce the output voltage 123.

Yet further in this example, the drain node of switch QA2 of phase 1122 is connected to receive voltage V1 provided by voltage source 120-1. The source node (S) of switch QA2 is coupled to the drain node (D) of switch QB2 as well as the input node of inductive path 1132. The source node of switch QB2 is coupled to ground. The output node of the inductive path 1132 (inductor device 311-2) is coupled to the load 118.

As previously discussed, the combination of the phases 221 and 222 produces the output voltage 123 that powers load 118. That is, the inductive path 1131 produces output voltage 123; inductive path 1132 produces output voltage 123.

During operation, as shown, controller 1140 produces control signals 105 (such as control signal A1 and control signal B1) to control states of respective switches QA1 and QB1. For example, the control signal A1 produced by the controller 1140 drives and controls the gate node of switch QA1; the control signal B1 produced by the controller 1140 drives and controls the gate node of switch QB1.

Additionally, controller 1140 produces control signals A2 and B2 to control states of switches QA2 and QB2. For example, the control signal A2 produced by the controller 1140 drives and controls the gate node of switch QA2; the control signal B2 produced by the controller 1140 drives and controls the gate node of switch QB2.

The controller 1140 may control the phases 1121 and 1122 to be 180 degrees or other suitable value out of phase with respect to each other. The shifting may change based on the number of phases.

As is known with buck converters, in phase 1121, activation of the high-side switch QA1 to an ON state while switch QB1 is deactivated (OFF) couples the input voltage V1 to the input of the inductive path 1131, causing an increase (such as ramped) in amount of current provided by the inductive path 1131 to the load 118. Conversely, activation of the low-side switch QB1 to an ON state while switch QA1 is deactivated (OFF) couples the ground reference voltage to the input of the inductive path 1131, causing a decrease (such as ramped) in amount of current provided by the inductive path 1131 to the load 118. The controller 1140 monitors a magnitude of the output voltage 123 and controls switches QA1 and QB1 such that the output voltage 123 stays within a desired voltage range.

Via phase 222, in a similar manner, activation of the high-side switch QA2 to an ON state while switch QB2 is deactivated (OFF) couples the input voltage V1 to the input of the inductive path 1132 causing an increase in amount of current provided by the inductive path 1132 to the load 118. Conversely, activation of the low-side switch QB2 to an ON state while switch QA2 is deactivated (OFF) couples the ground reference voltage to the input of the inductive path 1132, causing a decrease in amount of current provided by the inductive path 1132 to the load 118. The controller 1140 monitors a magnitude of the output voltage 123 and controls switches QA2 and QB2 such that the output voltage 123 stays within a desired voltage range.

Referring again to FIG. 12, note that the circuit 1201 includes one or more of controller 1140, with drivers, switches QA1, QB1, etc. Circuit 1202 includes one or more of controller 1140, switch drivers, switches QA2, QB2, etc.

Figure 14:
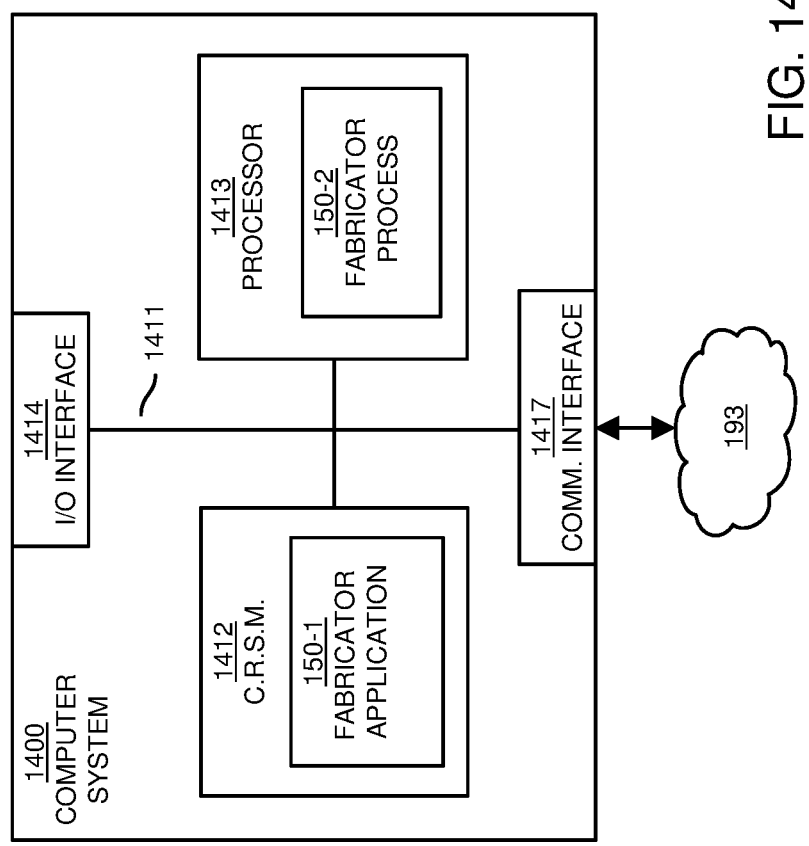
FIG. 14 is an example diagram illustrating computer processor hardware (such as fabrication equipment) and related software instructions that execute one or more fabrication methods according to embodiments herein.

FIG. 14 is an example diagram illustrating computer processor hardware (such as fabrication equipment) and related software instructions that execute one or more fabrication methods as discussed herein.

As shown, computer system 1400 (such as implemented by any of one or more resources such as a fabricator) of the present example includes an interconnect 1411 that couples computer readable storage media 1412 such as a non-transitory type of media (or hardware storage media) in which digital information can be stored and retrieved, a processor 1413 (e.g., computer processor hardware such as one or more processor devices), I/O interface 1414 (e.g., to output control signals to the power converter phases, monitor current, etc.), and a communications interface 1417.

I/O interface 1414 provides connectivity to any suitable circuitry such as power supply 100 and corresponding power converter phases 111, 112, etc.

Computer readable storage medium 1412 can be any hardware storage resource or device such as memory, optical storage, hard drive, floppy disk, etc. The computer readable storage medium 1412 stores instructions and/or data used by the fabricator application 150-1 to perform any of the operations as described herein.

Further in this example, communications interface 1417 enables the computer system 1400 and processor 1413 to communicate over a resource such as network 190 to retrieve information from remote sources and communicate with other computers.

As shown, computer readable storage media 1412 (such as computer-readable storage hardware) is encoded with fabricator application 150-1 (e.g., software, firmware, etc.) executed by processor 1413. Fabricator application 150-1 can be configured to include instructions to implement any of the operations as discussed herein.

During operation, processor 1413 may access computer readable storage media 1412 via the use of interconnect 1411 in order to launch, run, execute, interpret or otherwise perform the instructions in fabricator application 150-1 stored on computer readable storage medium 1412.

Execution of the fabricator application 150-1 produces processing functionality such as fabricator process 150-2 in processor 1413. In other words, the fabricator process 150-2 associated with processor 1413 represents one or more aspects of executing fabricator application 150-1 within or upon the processor 1413 in the computer system 1400.

In accordance with different examples, note that computer system 1400 can be a micro-controller device, logic, hardware processor, hybrid analog/digital circuitry, etc., configured to control a power supply and perform any of the operations as described herein.

Functionality supported by the different resources will now be discussed via flowchart in FIG. 15. Note that the steps in the flowcharts below can be executed in any suitable order.

Figure 15:
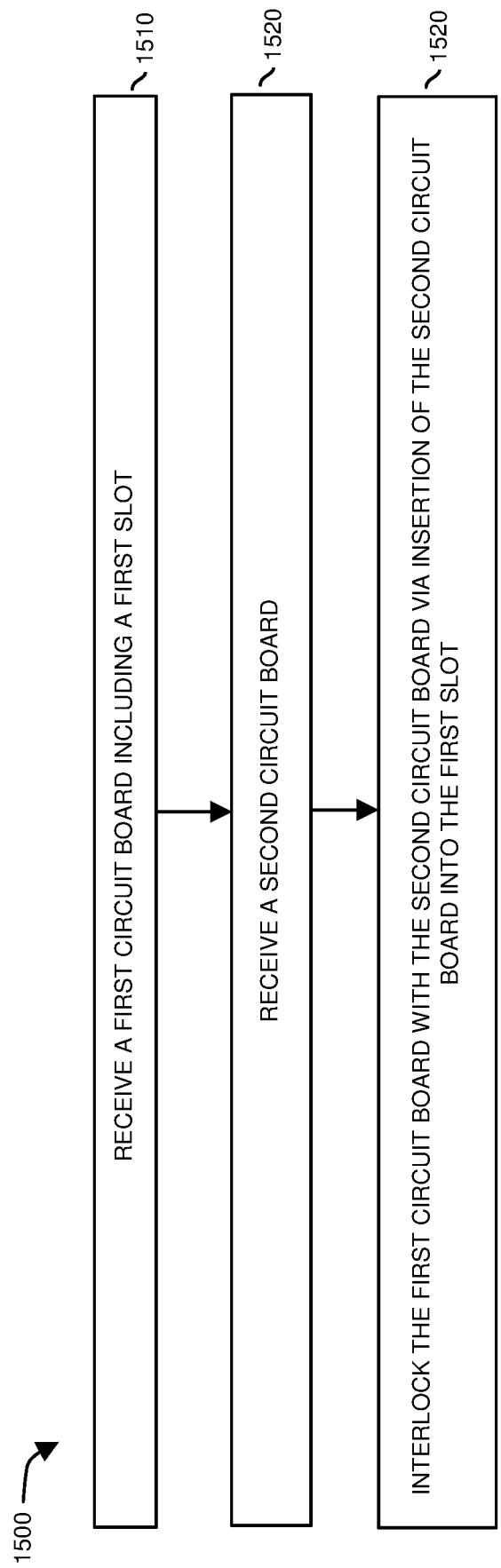
FIG. 15 is an example diagram illustrating a fabrication method according to embodiments herein.

FIG. 15 is a flowchart 1500 illustrating an example method as discussed herein. Note that there will be some overlap with respect to concepts as discussed above.

In processing operation 1510, the fabricator 150 receives a first circuit board including a first slot.

In processing operation 1520, the fabricator receives a second circuit board.

In processing operation, the fabricator 150 couples the first circuit board with the second circuit board via interlocking provided by the first slot.

Note again that techniques herein are well suited for use in circuit assembly applications such as those providing power delivery to one or more loads. However, it should be noted that the disclosure of matter herein is not limited to use in such applications and that the techniques discussed herein are well suited for other applications as well.

While this invention has been particularly shown and described with references to preferred aspects thereof, it will be understood by those skilled in the art that various changes in form and details may be made therein without departing from the spirit and scope of the present application as defined by the appended claims. Such variations are intended to be covered by the scope of this present application. As such, the foregoing description in the present disclosure is not intended to be limiting. Rather, any limitations to the invention are presented in the following claims.

The invention claimed is:

1. An apparatus comprising:
a first circuit board including a first slot;
a second circuit board including a second slot;
the first circuit board interlocked with the second circuit board via interlocking provided by the first slot and the second slot;
wherein a first portion of the second circuit board resides within the first slot of the first circuit board;
wherein a first portion of the first circuit board resides within the second slot of the second circuit board; and
the apparatus further comprising: i) a first assembly affixed to a first surface of the first circuit board, the first assembly including a first inductor device, the first inductor device including a first electrically conductive path extending lengthwise along a first axis from a first terminal of the first inductor device to a second terminal of the first inductor device; and ii) a second assembly affixed to the first surface of the first circuit board. the second assembly including a second inductor device. the second inductor device including a second electrically conductive path extending lengthwise along a second axis from a first terminal of the second inductor device to a second terminal of the second inductor device, the second axis disposed in parallel with the first axis.

2. The apparatus as in claim 1 further comprising:
a third circuit board;
a fourth circuit board;
wherein the first circuit board is in contact with and interlocked with the second circuit board and the fourth circuit board but not the third circuit board; and
wherein the second circuit board is in contact with and interlocked with the first circuit board and the third circuit board but not the fourth circuit board.

3. The apparatus as in claim 2, wherein
the first electrically conductive path is enveloped by magnetic permeable material; and
wherein a combination of the first circuit board, the second circuit board, the third circuit board, and the fourth circuit board is operative to enclose a volume in which the first inductor device resides.

4. The apparatus as in claim 3 further comprising:
a first circuit substrate;
a second circuit substrate; and
wherein the combination resides between a first circuit substrate and a second circuit substrate.

5. The apparatus as in claim 4, wherein the first terminal of the first electrically conductive path is a first axial end of the inductor coupled to the first circuit substrate and the second terminal of the first electrically conductive path is a second axial end of the inductor coupled to the second circuit substrate; and
wherein the first inductor device is operative to provide a flow of current from the first circuit substrate through the first electrically conductive path to the second circuit substrate.

6. The apparatus as in claim 5, wherein the first circuit board, the second circuit board, the third circuit board, and the fourth circuit board are disposed orthogonal to the first circuit substrate and the second circuit substrate.

7. The apparatus as in claim 1,
wherein both the first circuit board and the second circuit board are disposed substantially orthogonal to a first circuit substrate and a second circuit substrate.

8. The apparatus as in claim 1, wherein the first inductor device is operative to
to a load; and
wherein the first circuit board provides a return current path from the load to a reference potential.

9. The apparatus as in claim 1 further comprising:
first capacitors disposed on the first circuit board, the first capacitors storing an input voltage;
second capacitors disposed on the second circuit board, the second capacitors storing an output voltage; and
wherein a power converter circuit including the first inductor device is operative to convert the input voltage into the output voltage.

10. The apparatus as in claim 1, wherein the first circuit board is disposed non-parallel to the second circuit board.

11. The apparatus as in claim 1 further comprising:
a first edge contact disposed on a first axial end of the first circuit board;
a second edge contact disposed on a second axial end of the first circuit board; and
wherein the first circuit board provides electrical connectivity between the first edge contact and the second edge contact.

12. The apparatus as in claim 1, wherein the first circuit board includes a first axial end and a second axial end; and
wherein the first slot extends through a less-than-all length of the first circuit board starting from the first axial end of the first circuit board towards the second axial end of the first circuit board.

13. The apparatus as in claim 1, wherein both the first axis and the second axis are disposed in parallel to the first surface of the first circuit board.

14. The apparatus as in claim 13, wherein the second circuit board is disposed between the first inductor assembly and the second inductor assembly.

15. The apparatus as in claim 14 further comprising:
multiple circuit components disposed on a second surface of the first circuit board, the second surface disposed opposite the first surface; and
wherein a combination of the multiple circuit components and the first inductor device and the second inductor device is a power converter operative to convert an input voltage into an output voltage outputted by both the second terminal of the first inductor device and the second terminal of the second inductor device.

16. The apparatus as in claim 15, wherein each of the first terminal of the first inductor device, the first terminal of the second inductor device, a first edge of the first circuit board, and a first edge of the second circuit board are directly coupled to a first substrate; and
wherein each of the second terminal of the first inductor device, the second terminal of the second inductor device, a second edge of the first circuit board, and a second edge of the second circuit board are directly coupled to a second substrate.

17. The apparatus as in claim 16, wherein the first edge of the first circuit board includes multiple connector elements operative to convey respective first electrical signals;
wherein the second edge of the first circuit board includes multiple connector elements operative to convey the respective first electrical signals;
wherein the first edge of the second circuit board includes multiple connector elements operative to convey respective second electrical signals; and
wherein the second edge of the second circuit board includes multiple connector elements operative to convey the respective second electrical signals.

18. The apparatus as in claim 17 further comprising:
a third circuit board;
a fourth circuit board;
wherein the first circuit board is in contact with and interlocked with the second circuit board and the fourth circuit board but not the third circuit board;
wherein the second circuit board is in contact with and interlocked with the first circuit board and the third circuit board but not the fourth circuit board; and
wherein a combination of the first circuit board, the second circuit board, the third circuit board, and the fourth circuit board is configured to enclose a volume in which the first inductor device resides.

19. The apparatus as in claim 18 further comprising:
multiple electrically conductive paths disposed on the first circuit board, the multiple electrically conductive paths extending between the first edge of the first circuit board and the second edge of the first circuit board; and
wherein the multiple electrically conductive paths are operative to convey signals between the first substrate and the second substrate.

20. The apparatus as in claim 14 further comprising:
a third circuit board;
a fourth circuit board;
wherein the first circuit board is in contact with and interlocked with the second circuit board and the fourth circuit board but not the third circuit board; and
wherein the second circuit board is in contact with and interlocked with the first circuit board and the third circuit board but not the fourth circuit board.

21. The apparatus as in claim 20, wherein a combination of the first circuit board, the second circuit board, the third circuit board, and the fourth circuit board encloses a volume in which the inductor device resides.

22. The apparatus as in claim 19, wherein the first circuit board, the second circuit board, the third circuit board, and the fourth circuit board are disposed orthogonal to the first substrate and the second substrate.

* * * * *

UNITED STATES PATENT AND TRADEMARK OFFICE
CERTIFICATE OF CORRECTION

PATENT NO. : 12,309,928 B2
APPLICATION NO. : 17/952859
DATED : May 20, 2025
INVENTOR(S) : Darryl Galipeau, Danny R. Clavette and Darryl Tschirhart Page 1 of 1

It is certified that error appears in the above-identified patent and that said Letters Patent is hereby corrected as shown below:

In the Claims

Column 17 Line 64 Claim 1, Line 18, replace "board." with --board,--

Column 17 Line 66 Claim 1, Line 20, replace "device." with --device,--

Column 18 Line 45 Claim 8, Line 2, replace "to" with --to convey current--

Signed and Sealed this
Twenty-ninth Day of July, 2025

Coke Morgan Stewart
*Acting Director of the United States Patent and Trademark Office*